United States Patent
Cesaretti

(10) Patent No.: US 9,551,762 B1
(45) Date of Patent: Jan. 24, 2017

(54) CIRCUITS AND METHODS FOR REMOVING A GAIN OFFSET IN A MAGNETIC FIELD SENSOR

(71) Applicant: Allegro MicroSystems, LLC, Worcester, MA (US)

(72) Inventor: Juan Manuel Cesaretti, Ciudad de Buenos Aires (AR)

(73) Assignee: Allegro MicroSystems, LLC, Worcester, MA (US)

( * ) Notice: Subject to any disclaimer, the term of this patent is extended or adjusted under 35 U.S.C. 154(b) by 4 days.

(21) Appl. No.: 14/812,313

(22) Filed: Jul. 29, 2015

(51) Int. Cl.
G01R 33/07 (2006.01)
G01R 35/00 (2006.01)
G01R 33/00 (2006.01)

(52) U.S. Cl.
CPC ....... *G01R 33/0035* (2013.01); *G01R 33/0017* (2013.01); *G01R 33/07* (2013.01)

(58) Field of Classification Search
CPC .................................................. G01R 33/07
USPC ........................................................ 324/251
See application file for complete search history.

(56) References Cited

U.S. PATENT DOCUMENTS

| | | | |
|---|---|---|---|
| 7,923,996 B2 | 4/2011 | Doogue et al. | |
| 8,030,918 B2 | 10/2011 | Doogue et al. | |
| 8,542,010 B2 | 9/2013 | Cesaretti et al. | |
| 8,680,846 B2 | 3/2014 | Cesaretti et al. | |
| 8,692,546 B2 | 4/2014 | Cesaretti et al. | |
| 2013/0214774 A1 | 8/2013 | Cesaretti et al. | |
| 2014/0084912 A1* | 3/2014 | Van Vroonhoven | 324/251 |

OTHER PUBLICATIONS

U.S. Appl. No. 14/681,575, filed Apr. 8, 2015, Juan Manuel Cesaretti et al.
U.S. Appl. No. 14/255,166, filed Apr. 17, 2014, Cesaretti et al.
Wu et al.; "A Current-Feedback Instrumentation Amplifier with a Gain Error Reduction Loop and 0.06% Untrimmed Gain Error," IEEE Journal of Solid-State Circuits, vol. 46, No. 12; Dec. 2011; 2794-2806 pages.

* cited by examiner

*Primary Examiner* — Bot Ledynh
(74) *Attorney, Agent, or Firm* — Daly, Crowley, Mofford & Durkee, LLP

(57) ABSTRACT

A magnetic field sensor and a method include a modulator coupled in a feedback arrangement and operable to modulate a calibration feedback signal with a modulator clock signal having a selected frequency and a selected relative phase operable to remove a gain error in the magnetic field sensor and in the method.

23 Claims, 28 Drawing Sheets

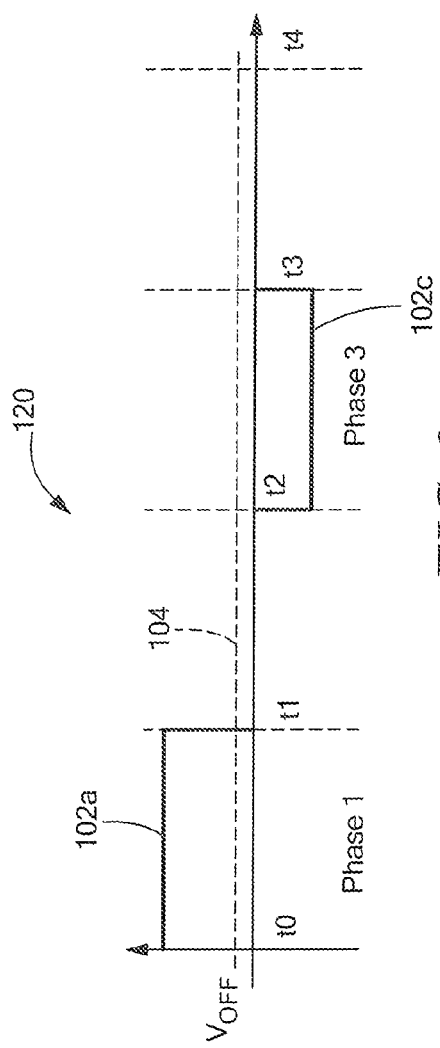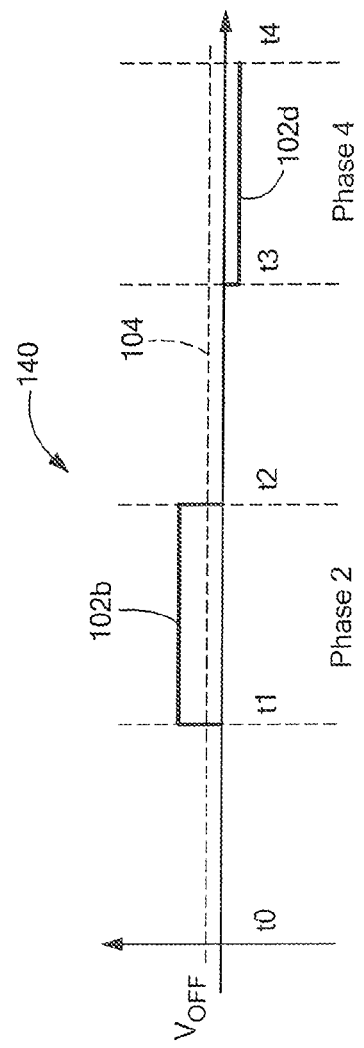

CIRCUITS AND METHODS FOR REMOVING A GAIN OFFSET IN A MAGNETIC FIELD SENSOR

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to magnetic field sensors having a feedback arrangement to calibrate a sensitivity of the magnetic field sensor and for removing a gain offset component in the magnetic field sensor.

BACKGROUND OF THE INVENTION

As is known, there are a variety of types of magnetic field sensing elements, including, but not limited to, Hall effect elements, magnetoresistance elements, and magnetotransistors. As is also known, there are different types of Hall effect elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Hall effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, which use magnetic field sensing elements, are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor that senses a magnetic field density of a magnetic field. Magnetic switches are used as examples herein. However, the circuits and techniques described herein apply also to any magnetic field sensor.

As is known, some integrated circuits have internal built-in self-test (BIST) capabilities. A built-in self-test is a function that can verify all or a portion of the internal functionality of an integrated circuit. Some types of integrated circuits have built-in self-test circuits built directly onto the integrated circuit die. Typically, the built-in self-test is activated by external means, for example, a signal communicated from outside the integrated circuit to dedicated pins or ports on the integrated circuit. For example, an integrated circuit that has a memory portion can include a built-in self-test circuit, which can be activated by a self-test signal communicated from outside the integrated circuit. The built-in self-test circuit can test the memory portion of the integrated circuit in response to the self-test signal.

Conventional built-in self-test circuits used in magnetic field sensors tend not to test the magnetic field sensing element used in the magnetic field sensor. Conventional built-in self-test circuits also tend not to test all of the circuits with a magnetic field sensor.

Some magnetic field sensors employ self-calibration techniques, for example, by locally generating a calibration magnetic field with a coil or the like, measuring a signal resulting from the calibration magnetic field, and feeding back a signal related to the resulting signal to control a gain of the magnetic field sensor. Self-calibration arrangements are shown and described in U.S. Pat. No. 7,923,996, issued April 122, 2011, and assigned to the assignee of the present invention. Also U.S. Pat. No. 8,542,010, issued Sep. 24, 2013, and assigned to the assignee of the present invention, teaches various arrangements of coils and conductors disposed proximate to magnetic field sensing elements and used to generate a self-test magnetic field. The above patent also teaches various multiplexing arrangements. Also, U.S. Pat. No. 8,680,846, issued Mar. 25, 2014, assigned to the assignee of the present invention, teaches a magnetic field sensor with a feedback calibration arrangement. These patents, and all other patents and patent applications mentioned herein, are incorporated by reference herein in their entirety.

Typically, calibration of the magnetic field sensor must be performed when the magnetic field sensor is not sensing a sensed magnetic field, i.e., when the magnetic field sensor is not operating in its regular sensing mode.

Some calibration circuits have a feedback arrangement with a gain error.

It would be desirable to provide built in self-test circuits and techniques in a magnetic field sensor that allow the self-test function to test a magnetic field sensing element used within the magnetic field sensor. It would also be desirable to provide built in self-test circuits and techniques in a magnetic field sensor that allow the self-test all of the circuits within the magnetic field sensor.

In addition to the self-test function, it would be desirable to provide a gain adjustment (calibration) of the magnetic field sensor that can occur as the magnetic field sensor operates in normal operation. It would also be desirable to be able to perform the self-test and the calibration regardless of a magnitude of an external magnetic field.

It would also be desirable to eliminate the effect of a feedback gain error in the calibration of the magnetic field sensor.

SUMMARY OF THE INVENTION

The present invention can provide built in self-test circuits and techniques in a magnetic field sensor that allow the self-test function to test a magnetic field sensing element used within the magnetic field sensor. The present invention can also provide built in self-test circuits and techniques in a magnetic field sensor that allow the self-test all of the circuits within the magnetic field sensor.

The present invention can also provide a gain adjustment (calibration) of the magnetic field sensor that can occur as the magnetic field sensor operates in normal operation. The present invention can also perform the self-test and the calibration regardless of a magnitude of an external magnetic field. The present invention can also reduce or eliminate the effect of a feedback gain error in the calibration of the magnetic field sensor.

In accordance with an example useful for understanding an aspect of the present invention, a magnetic field sensor comprises one or more of the following:

two or more Hall effect elements coupled together for generating a Hall effect element signal having a magnetic field component and an offset component, the magnetic field component responsive to an external magnetic field;

a switching circuit coupled to the Hall effect element and configured to generate a chopped signal representative of a four phase current spinning of the Hall effect element, the four phase current spinning having four phases including a first phase, a second phase following the first phase, a third phase following the second phase, and a fourth phase following the third phase, the four phases periodically repeating, wherein changes between the four phases occur at a phase rate;

a first modulator coupled to the chopped signal and configured to modulate a signal related to the chopped signal with a first modulator clock signal, wherein the first modulator clock signal has a first frequency for which changes of states of the first modulator clock signal occur at the phase rate;

a channel amplifier coupled to the first modulated signal, coupled to a gain adjustment signal, and configured to generate an amplified signal having a gain responsive to the gain adjustment signal, wherein the gain of the channel amplifier has a gain average component and a gain offset component;

a second modulator coupled to the amplified signal and configured to modulate a signal related to the amplified signal with a second modulator clock signal having the same first frequency to generate a second modulated signal;

an error amplifier coupled to a calibration signal, the calibration signal representative of a measured sensitivity of at least a portion of the magnetic field sensor in response to a calibration magnetic field, the error amplifier operable to compare the calibration signal to a reference signal to generate a comparison signal;

a third modulator coupled to the comparison signal and configured to modulate a signal related to the comparison signal with a third modulator clock signal having a second different frequency equal to the first frequency divided by two to generate a third modulated signal, wherein a first state of the third modulator clock signal occurs during the second and third phase of the four phases and a second state of the third modulator clock signal occurs during the first and fourth phases of the four phases, wherein the gain adjustment signal received by the channel amplifier comprises the third modulated signal; or a filter coupled to the second modulator signal and operable to generate a magnetic field sensor signal responsive to the external magnetic field, the magnetic field sensor signal responsive the external magnetic field, the magnetic field sensor signal having an amplitude more responsive to the gain average component than to the gain offset component.

In accordance with an example useful for understanding another aspect of the present invention, a method of calibrating a magnetic field sensor comprises one or more of the following:

generating, with two or more Hall effect elements coupled together, a Hall effect element signal having a magnetic field component and an offset component, the magnetic field component responsive to the magnetic field;

current spinning, with a switching circuit, the field sensing element in four current spinning phases, the four current spinning phases including a first phase, a second phase immediately following the first phase, a third phase immediately following the second phase, and a fourth phase immediately following the third phase, the four current spinning phases periodically repeating, wherein changes between the four current spinning phases occur at a phase rate;

modulating the chopped signal with a first modulator, the first modulator configured to modulate a signal related to the chopped signal with a first modulator clock signal having the first frequency to generate a first modulated signal, wherein the first modulator clock signal has a first frequency for which changes of states of the first modulator clock signal occur at the phase rate;

amplifying the first modulated signal with a channel amplifier, the channel amplifier coupled to a gain adjustment signal, the channel amplifier to generate an amplified signal having a gain responsive to the gain adjustment signal, wherein the gain of the channel amplifier has a gain average component and a gain offset component;

modulating the amplified signal with a second modulator, the second modulator configured to modulate a signal related to the amplified signal with a second modulator clock signal having the same first frequency to generate a second modulated signal;

amplifying a calibration signal with an error amplifier, the calibration signal representative of a measured sensitivity of at least a portion of the magnetic field sensor in response to a calibration magnetic field, the error amplifier operable to compare the calibration signal to a reference signal to generate a comparison signal;

modulating the comparison signal with a third modulator, the third modulator configured to modulate a signal related to the comparison signal with a third modulator clock signal having a second different frequency equal to the first frequency divided by two to generate a third modulated signal, wherein a first state of the third modulator clock signal occurs during the second and third phase of the four phases and a second state of the third modulator clock signal occurs during the first and fourth phases of the four phases, wherein the gain adjustment signal received by the channel amplifier comprises the third modulated signal; or filtering the second modulator signal with a filter, the filter operable to generate a magnetic field sensor signal responsive to the external magnetic field, the magnetic field sensor signal responsive the external magnetic field, the magnetic field sensor signal having an amplitude more responsive to the gain average component than to the gain offset component.

BRIEF DESCRIPTION OF THE DRAWINGS

The foregoing features of the invention, as well as the invention itself may be more fully understood from the following detailed description of the drawings, in which:

FIG. 9 is a graph showing output signals from the two Hall elements of FIG. 7 showing signals only during first and third phases of FIG. 7 corresponding to measured-field-sensing configurations of the two Hall elements;

FIG. 10 is a graph showing output signals from the two Hall elements of FIG. 7 showing signals only during second and fourth phases of FIG. 7 corresponding to the reference-field-sensing configuration of the two Hall elements;

DETAILED DESCRIPTION OF THE INVENTION

Figure 1:
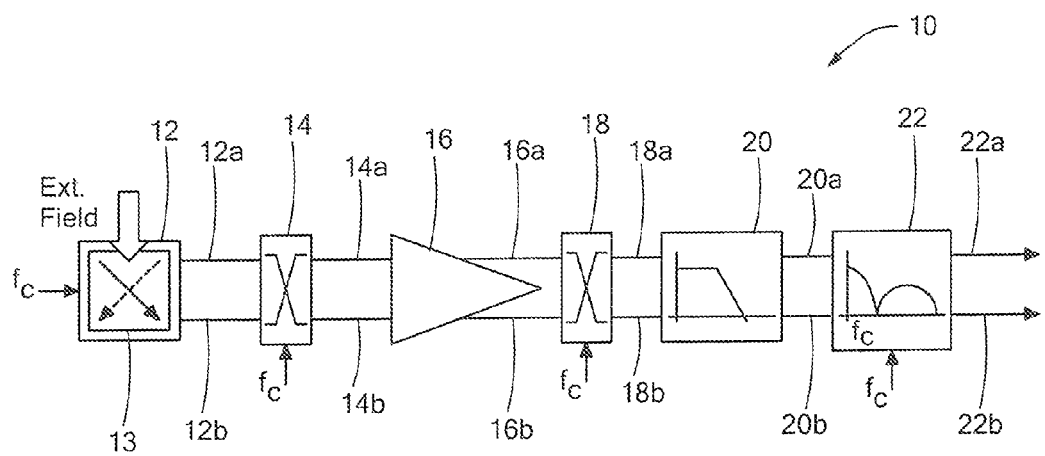
FIG. 1 is a block diagram of a prior art magnetic field sensor, and, in particular a magnetic switch that has a chopped (or switched) Hall effect element, and an associated switching circuit.

Before describing the present invention, some introductory concepts and terminology are explained. As used herein, the term "magnetic field sensing element" is used to describe a variety of types of electronic elements that can sense a magnetic field. The magnetic field sensing elements can be, but are not limited to, Hall effect elements, magnetoresistance elements, or magnetotransistors. As is known, there are different types of Hall effect elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

As is known, some of the above-described magnetic field sensing elements tends to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most, but not all, types of magnetoresistance elements tend to have axes of maximum sensitivity parallel to the substrate and most, but not all, types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor (e.g., a linear magnetic field sensor) that senses a magnetic field density of a magnetic field. Linear magnetic field sensors are used as examples herein. However, the circuits and techniques described herein apply also to any magnetic field sensor capable of detecting a magnetic field.

As used herein, the term "magnetic field signal" is used to describe any circuit signal that results from a magnetic field experienced by a magnetic field sensing element.

Reference-field-sensing configuration modes of operation described below are generally used to adjust a gain or a sensitivity of a magnetic field sensor. However, the reference-field-sensing configuration can also be used to provide a self-test of the magnetic field sensor. Namely, if no output signal is generated during a reference field mode of operation (or, in the case of a linear magnetic field sensor, the output signal is too low or too high), the magnetic field sensor is deemed to have failed. Thus, as used herein, the term "reference" is used to encompass sensitivity measurement (self-test) and calibration.

Referring to FIG. 1, a prior art magnetic field sensor 10 includes a Hall effect element 13 coupled within a switching circuit 12. The switching circuit 12 is configured to generate a differential output signal 12a, 12b responsive to an external magnetic field. Many signals described below can be differential signals, however, the term differential is not used in all instances. In other embodiments, some or all of the signals are single ended signals.

The switching circuit 12 is more fully described below in conjunction with FIGS. 2-2C. Let it suffice here to say that the switching circuit 12 switches a drive signal (not shown) to the Hall effect element 12 with a clock at a frequency of $f_c$.

The magnetic field sensor 10 also includes a switching circuit 14 coupled to receive the signal 12a, 12b and configured to generate a chopped signal 14a, 14b. The switching circuit 14 is also switched with the clock at a frequency of $f_c$. Combined operation of the switching circuit 12 with the switching circuit 14 is described more fully below in conjunction with FIGS. 3-3C.

An amplifier 16 is coupled to receive the chopped signal 14a, 14b and configured to generate an amplified signal 16a, 16b. A switching circuit 18 is coupled to receive the amplified signal 16a, 16b and configured to generate a demultiplexed signal 18a, 18b. The switching circuit 18 is clocked with the clock at the frequency, $f_c$. A low pass filter 20 is coupled to receive the demultiplexed signal 18a, 18b and configured to generate a filtered signal 20a, 20b. A sin x/x (sinc) filter 22 is coupled to receive the filtered signal 20a, 20b and configured to generate a filtered signal 22a, 22b, i.e., an output signal from the magnetic field sensor 10.

In some embodiments, the sinc filter 22 is a switched capacitor filter having a first notch at a frequency $f_c$. However, in other embodiments, the sinc filter 22 is generated digitally. In still other embodiments, the sinc filter 22 is an analog unclocked filter.

It will be understood that clock frequency provided to the sinc filter 22 can be at a frequency of $f_c$ as shown to provide the notch at the frequency $f_c$. However, it will also be understood that the sinc filter 22 can be designed to have the notch at the frequency $f_c$ but using a clock signal at a different frequency. In conjunction with figures below (e.g., FIGS. 7-8G), the clock provided to the sinc filter 22 is described to be at the frequency $f_c$. However, it is the notch frequency at the frequency $f_c$ that is desired.

It will be understood that the magnetic field sensor output signal 22a, 22b is a linear signal proportional to a magnetic field experience by the magnetic field sensing element 12 and that the magnetic field sensor 10 is a linear magnetic field sensor. However, in other embodiments, a comparator can receive the signal 22a, 22b, the magnetic fields sensor output signal thus generated by the comparator is a two-state signal, and the magnetic field sensor is a magnetic switch. It will also be understood that, in some embodiments, only one of the filters 20, 22 is used.

Operation of the magnetic field sensor of FIG. 1 is described below in conjunction with FIG. 1A.

Figure 1A:
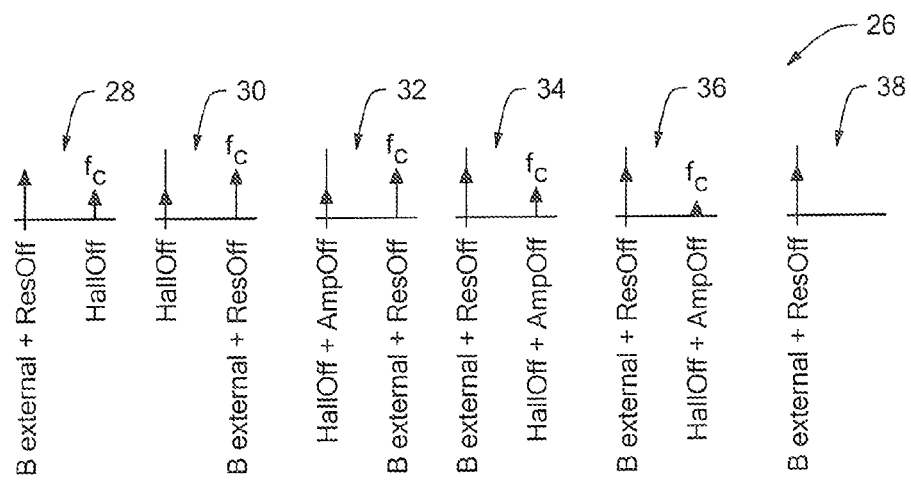
FIG. 1A is a series of graphs showing frequency spectrums at various points in the prior art magnetic field sensor of FIG. 1.

Referring now to FIG. 1A, graphs 26 each include a horizontal axis having units of frequency in arbitrary units and a vertical axis having units of power in arbitrary units.

A graph 28 is representative of the signal 12a, 12b, (i.e., frequency spectra of the signal 12a, 12b) and shows an external magnetic field signal, Bexternal, plus a residual offset signal, ResOff, appearing at a frequency, which can be a zero frequency indicative of a DC external magnetic field. A Hall effect offset signal, HallOff, is at a different frequency, according to a frequency of the clock, $f_c$. This effect is further described in conjunction with FIGS. 2-2C.

The Hall effect offset signal, HallOff, corresponds to a DC voltage error that would be present in the output signal 12a, 12b of the Hall effect element 13, but when the switching circuit 12 is not switching, i.e., when the current through the Hall effect elements 104, 106 is directed in one particular respective direction. As shown in the graph 28, the Hall effect offset signal, HallOff, is shifted to a higher frequency in the differential signal 12a, 12b by switching operation of the switching circuit 12 (and is shifted back to DC by operation of the switch circuit 14, as described below in conjunction with graph 30). The residual offset signal, ResOff, corresponds to a remaining offset signal that remains at DC in the differential signal 12a, 12b even when the switching circuit 12 is switching (and is shifted to a higher frequency by operation of the switching circuit 14, as described below in conjunction with graph 30).

A graph 30 is representative of the signal 14a, 14b, after chopping. The Hall offset signal, HallOff, is shifted to DC by operation of the switching circuit 14, and the signal Bexternal+ResOff is at the frequency $f_c$.

A graph 32 is representative of the signal 16a, 16b. In the graph 32, a DC offset of the amplifier 16 is added to the Hall offset signal at DC resulting in a signal HallOff+AmpOff at DC.

A graph 34 is representative of the signal 18a, 18b, after the switching circuit 18. As can be seen, the signal Bexternal+ResOff is now at DC and the signal HallOff+AmpOff is now at the frequency, $f_c$.

A graph 36 is representative of the signals 20a, 20b after the filter 20. A break frequency of the filter 20 is selected to be below the frequency, $f_c$. The signal HallOff+AmpOff is reduced, as is desired.

A graph 38 is representative of the signal 22a, 22b, after the sinc filter 22. The notch of the sinc filter 22 is selected to be at the frequency, $f_c$, i.e., at a Nyquist frequency of the sinc filter 22. Only the external magnetic field signal (plus some residual offset) remains in the graph 38 and in the signal 22a, 22b. The Hall effect element offset (HallOff) has been removed.

Figure 2:
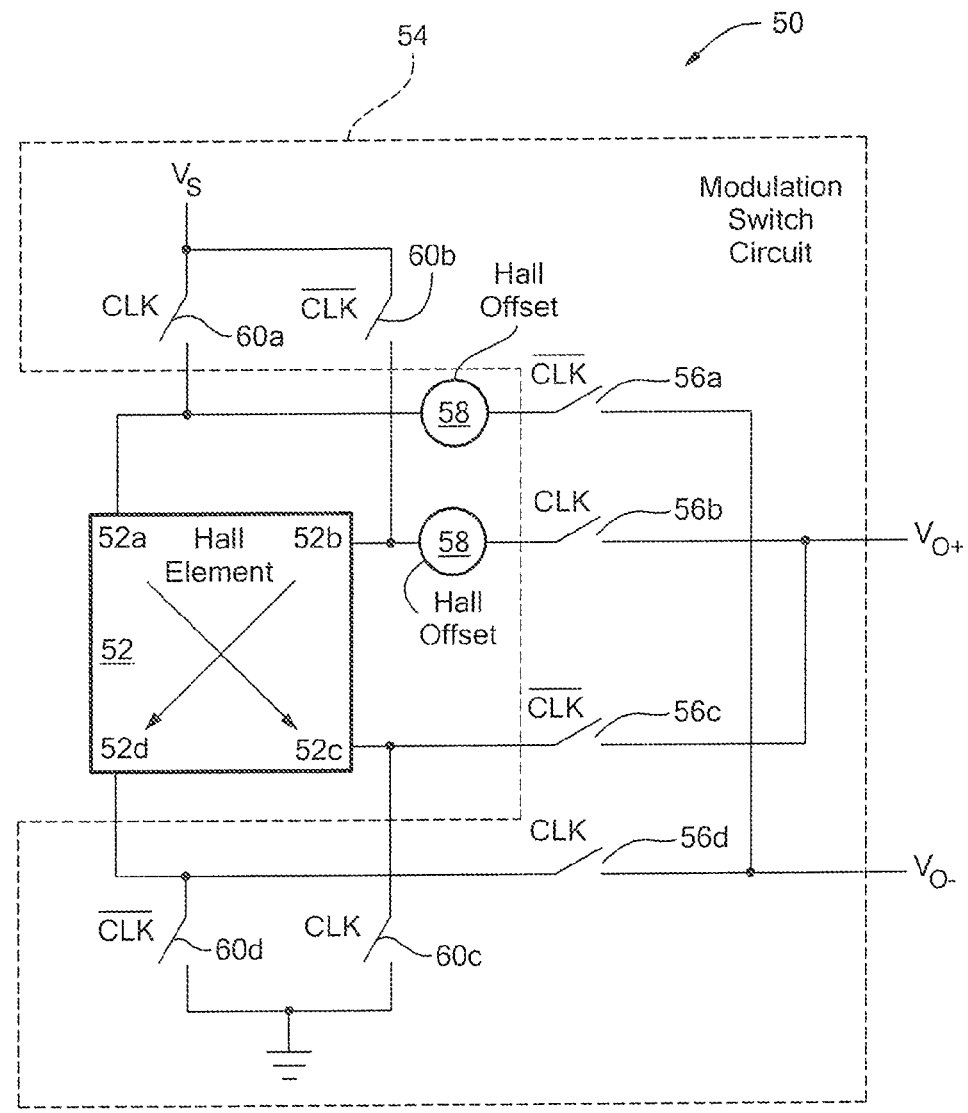
FIG. 2 is a block diagram showing a switched Hall element having a Hall effect element and having a switching circuit that can be used as the Hall effect element and the switching circuit of the magnetic field sensor of FIG. 1, and also as the Hall effect element and the switching circuit of magnetic field sensors below.
Figure 2A:
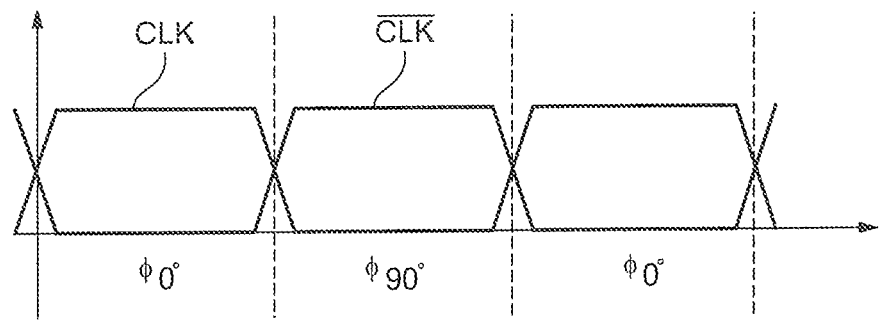
FIG. 2A is a graph showing clock signals for the switched Hall element of FIG. 2.
Figure 2B:
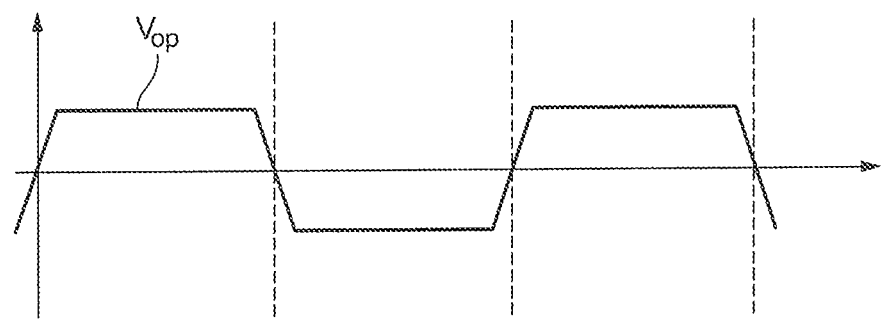
FIG. 2B is a graph showing a modulated offset component provided by the switched Hall element of FIG. 2.
Figure 2C:
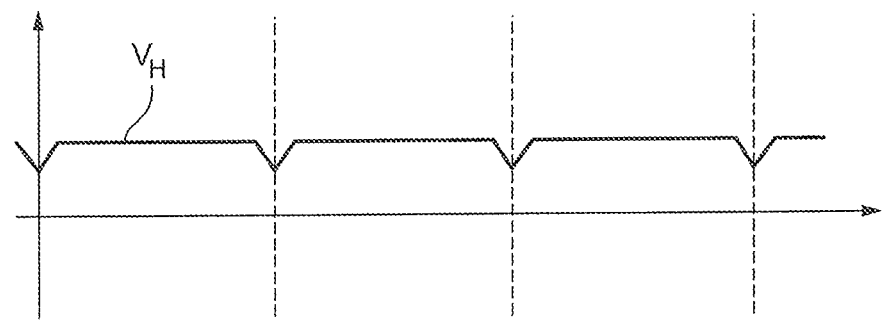
FIG. 2C is a graph showing an un-modulated magnetic field signal component provided by the switched Hall element of FIG. 2.

Referring now to FIGS. 2-2C, a switched Hall element 50 of a type that modulates a Hall offset component (e.g., 58) includes a Hall element (or Hall plate) 52 and a modulation circuit 54. The Hall element 52 includes four contacts 52a, 52b, 52c, and 52d, each coupled to a first terminal of a respective switch 56a, 56b, 56c, and 56d, as shown. Second terminals of switches 56b and 56c are coupled to provide a positive node of a switched Hall output signal, here labeled Vo+, and second terminals of switches 56a and 56d are coupled to provide a negative node of the switched Hall output signal, here labeled Vo−.

Additional switches 60a, 60b, 60c, and 60d are arranged to selectively couple the Hall contacts 52a, 52b, 52c, 52d to the supply voltage, Vs, and ground. More particularly, switches 56b, 56d, 60a, and 60c are controlled by a clock signal, CLK, and switches 56a, 56c, 60b, and 60d are controlled by a complementary clock signal, CLK/, as shown. The clock signals CLK and CLK/ have two states or phases, a $\Phi_{0°}$ state and a $\Phi_{90°}$ state, as shown in FIG. 2A.

In operation, during phase $\phi_{0°}$, current flows from the terminal 52a to the terminal 52c and the switched Hall output signal, Vo, is equal to $V_H + V_{op}$, where $V_{op}$ is the Hall element offset voltage or Hall offset component and $V_H$ is the magnetic field signal component. During the phase $\Phi_{90°}$, current flows from the terminal 52b to the terminal 52d and the switched Hall output signal, Vo, is equal to $V_H - V_{op}$. Thus, the modulation circuit 54 modulates the Hall offset component, $V_{op}$, which is shown in FIG. 2B for a zero Gauss magnetic field. The magnetic field signal component, $V_H$, remains substantially invariant, as shown in FIG. 2C.

The chopping circuit 50 of FIG. 2 can be used as the switching circuit 12 of FIG. 1 in a two-phase offset modulation arrangement. It will become apparent that other switching circuits can be used as the switching circuit 12 of FIG. 1 in four-phase offset modulation arrangements.

Figure 3:
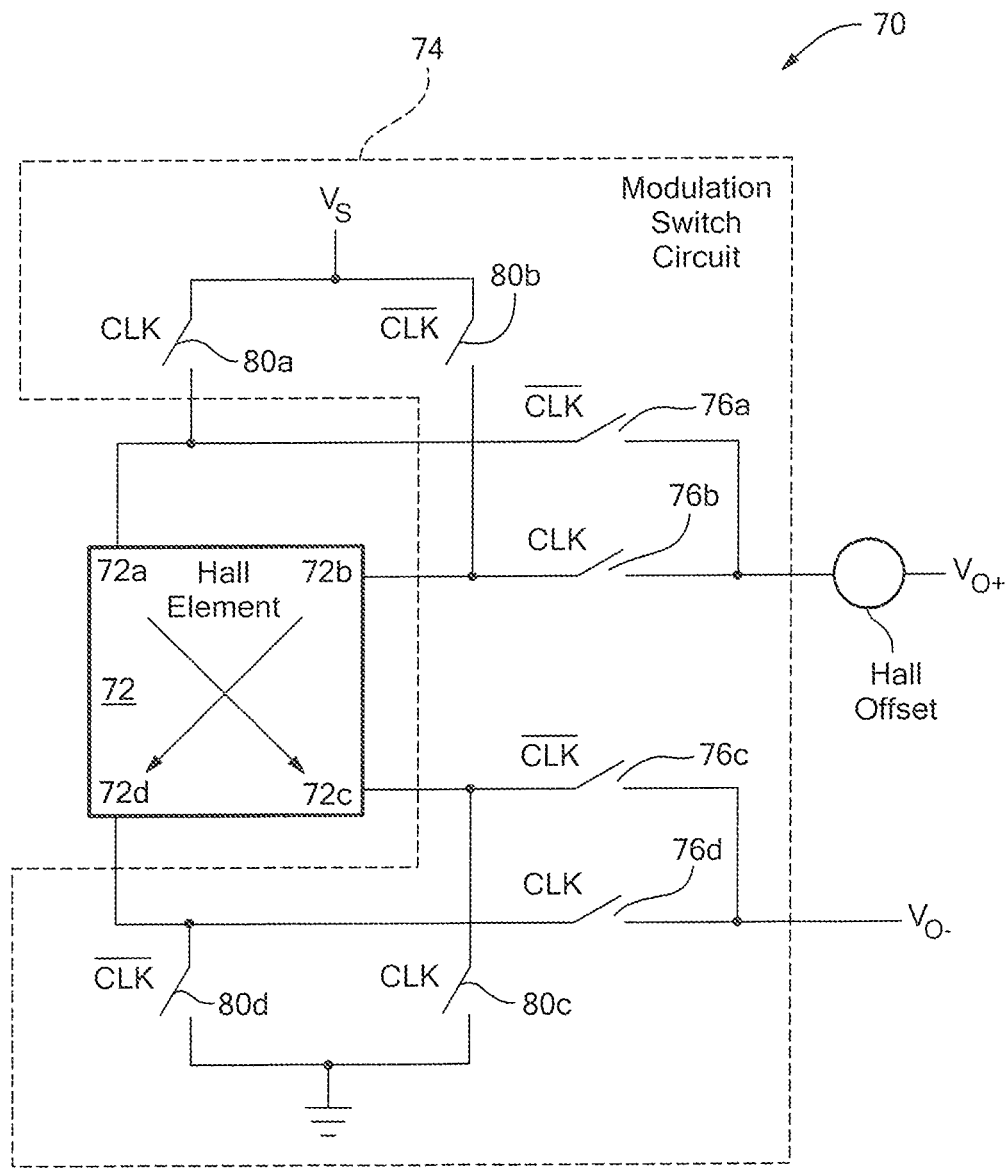
FIG. 3 is a block diagram showing a switched Hall element having a Hall effect element and having a switching circuit that can be used as the Hall effect element and the switching circuit in the sensor of FIG. 1, and also as the Hall effect element and the switching circuit of magnetic field sensors below.
Figure 3A:
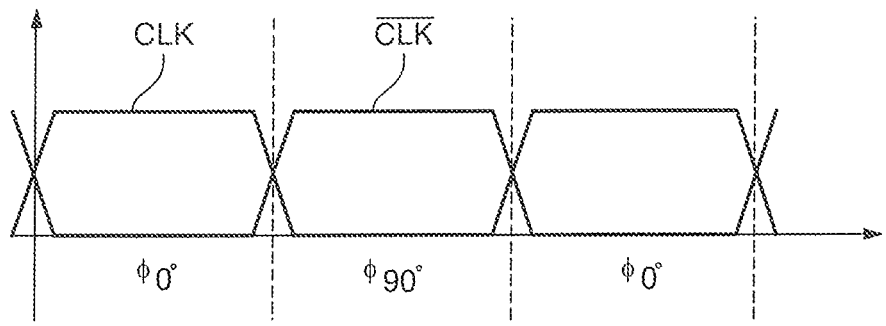
FIG. 3A is a graph showing clock signals for the switched Hall element of FIG. 3.
Figure 3B:
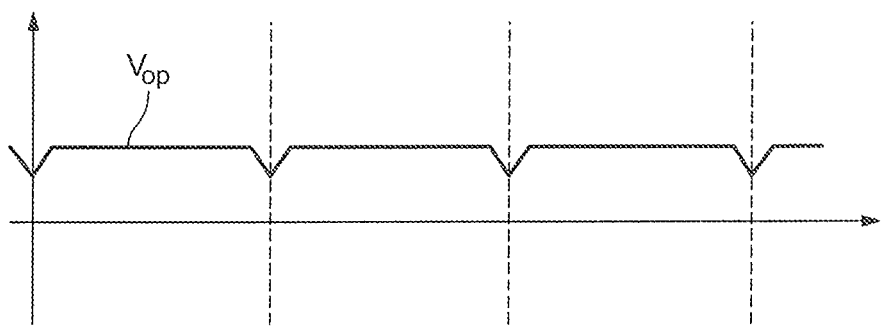
FIG. 3B is a graph showing an un-modulated offset component provided by the switched Hall element of FIG. 3.
Figure 3C:
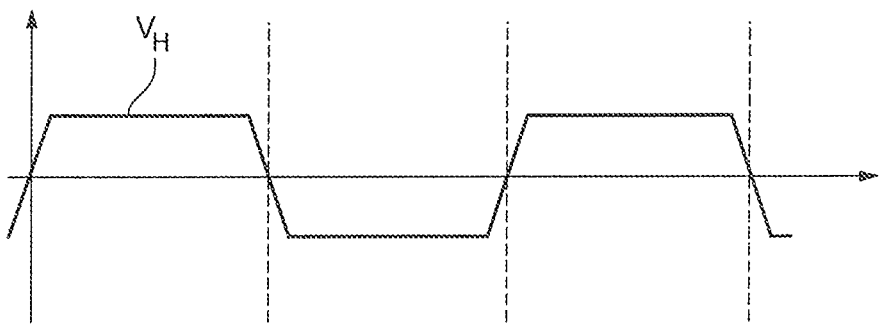
FIG. 3C is a graph showing a modulated magnetic field signal component provided by the switched Hall element of FIG. 3.

Referring now to FIGS. 3-3C, an alternative switched Hall element 70 of a type that modulates a magnetic field signal component includes a Hall element 72 and a modulation circuit 74. The Hall effect element 72 is the same as the Hall effect element 52 of FIG. 2 and includes four contacts 72a, 72b, 72c, and 72d, each coupled to a first terminal of a respective switch 76a, 76b, 76c, and 76d. Second terminals of switches 76a and 76b are coupled to provide a positive node of a switched Hall output signal, here labeled Vo+, and second terminals of switches 56c and 56d are coupled to provide a negative node of the switched Hall output signal, here labeled Vo−. Thus, a comparison of FIGS. 2 and 3 reveals that the output contacts of the Hall element are interchanged during the $\Phi_{90°}$ phase.

Additional switches 80a, 80b, 80c, and 80d are arranged to selectively couple the Hall contacts 72a, 72b, 72c, and 72d to the supply voltage Vs and ground. Switches 76b, 76d, 80a, and 80c are controlled by clock signal, CLK, and switches 76a, 76c, 80b, and 80d are controlled by a complementary clock signal, CLK/, as shown. Clock signals, CLK and CLK/, are identical to like signals in FIG. 2 and thus have two states or phases, $\Phi_{0°}$ and $\Phi_{90°}$ as shown.

In operation, during phase $\Phi_{0°}$, current flows from the terminal 72a to the terminal 72c, and the switched Hall output signal, Vo, is equal to $V_H + V_{op}$. During phase $\Phi_{90°}$, current flows from the terminal 72b to the terminal 72d, and the switched Hall output signal, Vo, is equal to $-V_H + V_{op}$. Thus, the modulation circuit 74 modulates the magnetic signal component to provide a modulated magnetic signal component, $V_H$, which is shown in FIG. 3C for a zero Gauss magnetic field. The offset component, $V_{op}$, remains substantially invariant as is shown in FIG. 3B.

It will be understood that the switches 80a-80d can form a switching circuit the same as or similar to the switching circuit 12 of FIG. 1. It will also be understood that the switches 76a-76d can form a switching circuit the same as or similar to the switching circuit 14 of FIG. 1.

The chopping circuit 70 of FIG. 3 can be used as the switching circuit 12 of FIG. 1 in a two phase signal modulation arrangement. It will become apparent that other switching circuits can be used as the switching circuit 12 of FIG. 1 in four-phase signal modulation arrangements. In some signal modulation arrangements, the switching circuit 14 can be omitted. Alternatively, another switching circuit (not shown) can be coupled between the switching circuit 12 and the switching circuit 14.

Figure 4:
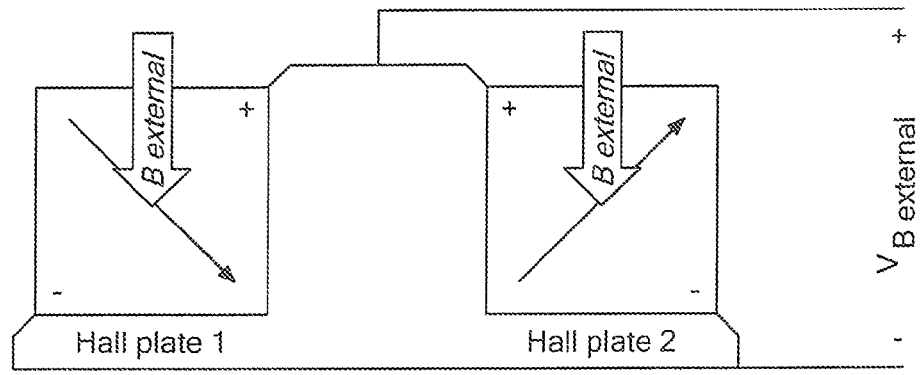
FIG. 4 is a block diagram showing two Hall effect elements arranged in parallel in a measured-field-sensing configuration, which would tend to respond in cooperation in the presence of an external magnetic field.

Referring now to FIG. 4, two Hall effect elements can be coupled together in parallel. The two Hall effect elements coupled in parallel can be used in place of any of the single Hall effect elements described above in conjunction with FIGS. 1-3C. Thus, the output (plus and minus) of the two parallel Hall effect elements can be used in place of a plus and minus output from one Hall effect element. Drive signals (not shown in FIG. 4) can drive the two parallel Hall effect elements just as they drive the one Hall effect element in any of the above figures.

The parallel arrangement of Hall effect elements is referred to herein as a measured-field-sensing configuration, as opposed to a reference-field-sensing configuration described more fully below.

Figure 5:
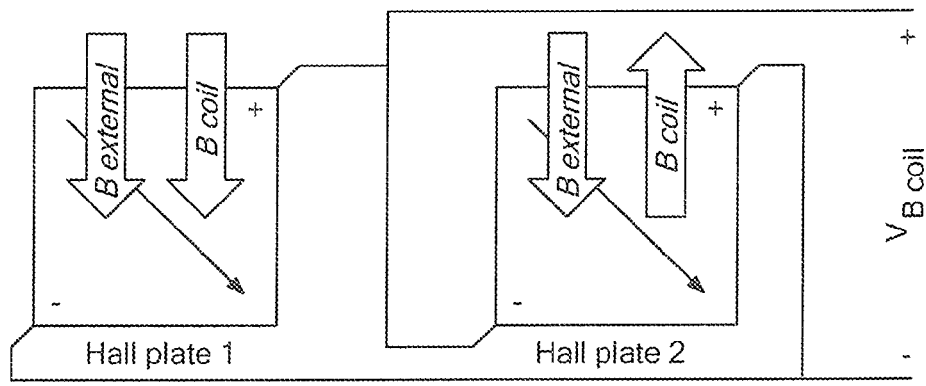
FIG. 5 is a block diagram showing the two Hall effect elements of FIG. 4, reconnected so as to be in a reference-field-sensing configuration, and in the presence of the external magnetic field of FIG. 4 and also in the presence of a two reference magnetic fields as may be generated in two opposite directions, e.g., by two respective coils.

Referring now to FIG. 5, the two Hall effect elements of FIG. 4 can be coupled together (i.e., re-connected) in a reference-field-sensing configuration. With this arrangement, it should be understood that the combination of the two Hall effect elements is substantially unresponsive to an external magnetic field, Bexternal, in the same direction as experienced by each one of the two Hall effect elements. A residual response to the external magnetic field can be due to a mismatch of the two Hall effect elements, which would result in a residual external magnetic field signal.

However, it will also be understood that, in response to two reference magnetic fields, Bcoil, in different directions as experienced by each one of the two Hall effect elements arranged in the reference-field-sensing configuration, the combination of the two magnetic field sensing elements does generate a non-zero output signal, $V_{Bcoil}$.

Figure 5A:
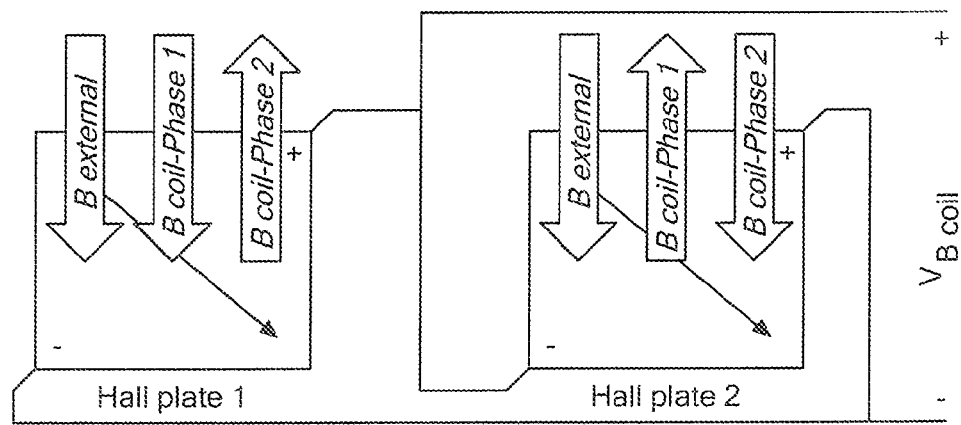
FIG. 5A is a block diagram showing the two Hall effect elements of FIG. 4, reconnected so as to be in the reference-field-sensing configuration, and in the presence of the external magnetic field of FIG. 5, and also in the presence of a two reference magnetic fields as may be generated in two opposite directions, e.g., by two respective coils, wherein the two reference magnetic fields are AC magnetic fields.

Referring now to FIG. 5A, the two Hall effect elements are again shown arranged in the reference-field-sensing configuration. Here, two phases (directions) of each of the two reference magnetic fields, Bcoil, are shown. In essence, in response to an AC reference magnetic field, the output signal, $V_{Bcoil}$, is an AC signal. However, when the two Hall effect elements are arranged in the reference-field-sensing configuration, the output signal has substantially zero contribution from the external magnetic field, which is in the same direction at both Hall effect elements, regardless of whether the external magnetic field is a DC magnetic field or an AC magnetic field.

Figure 6:
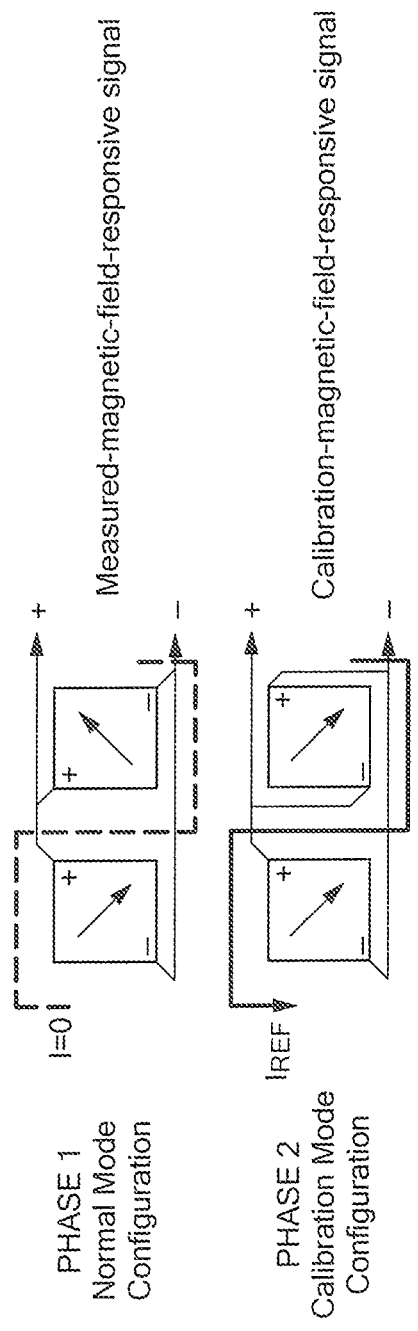
FIG. 6 is a block diagram showing two Hall elements for which couplings are alternated back and forth between the measured-field-sensing configuration and the reference-field-sensing configuration in two phases, and without chopping of the two Hall elements when in the measured-field-sensing configuration.

Referring now to FIG. 6, two magnetic field sensing elements, which are the same two magnetic field sensing elements, are shown in two different phase arrangements. The two different phase arrangements are achieved alternately by way of a switching circuit described more fully below in conjunction with FIG. 12.

As used herein, the word "phase" is used to describe both a coupling arrangement of two or more magnetic field sensing elements into the measured-field-sensing configuration or into the reference-field-sensing configuration and also a direction of a current passing through a reference field conductor, which is shown here to be a simple conductor, but which, in other arrangements described below, for example, in FIG. 12, can be comprised of two reference field coil portions. The word phase as used herein does not refer to a chopping arrangement, described more fully below.

Referring first to a phase 1 arrangement, the two magnetic field sensing elements are coupled in the measured-field-sensing configuration, which is the same as or similar to the coupling arrangement described above in conjunction with FIG. 4. As described above, with this coupling arrangement, the two magnetic field sensing elements are responsive to an external magnetic field as may be received from the environment and collectively generate a so-called "measured-magnetic-field-responsive signal."

A reference field conductor is shown as dashed line, the dashed line indicative of no current being carried by the reference field conductor. However, in an alternate embodiment, the reference field conductor can carry a current, IREF.

It will be recognized that a current carried by the reference field conductor generates a circular magnetic field around the reference field conductor. It will also be recognized that, due to the path of the reference field conductor, the magnetic field has a direction into the page at the right-hand magnetic field sensing element and out of the page at the left-hand magnetic field sensing element. Thus, two magnetic fields generated by the reference field conductor are in opposite directions at the two magnetic field sensing elements. Because the two magnetic field sensing elements are coupled in parallel in the measured-field-sensing configuration and both have the same direction of response, the output signal generated by the two magnetic field sensing elements in response to a current carried by the reference field conductor will be zero of near zero.

Thus, any current passing through the reference field conductor has little or no effect on an output signal generated collectively by the two magnetic field sensing elements when coupled in the measured-field-sensing configuration.

In contrast, in response to a measured magnetic field, as may be received from the environment, which passes through both of the Hall elements in the same direction, the measured-magnetic-field-responsive signal is not zero. Thus, when coupled in the phase 1 arrangement, the two magnetic field sensing elements are not responsive to a magnetic field generated by the reference field conductor, but are responsive to a measured (external of normal) magnetic field.

In a phase 2 arrangement, the two magnetic field sensing elements are coupled in the reference-field-sensing configuration, which is the same as or similar to the coupling arrangement described above in conjunction with FIGS. 5 and 5A. From discussion above, it will be understood that, when in the reference-field-sensing configuration, the two magnetic field sensing elements are responsive in opposite directions to magnetic fields perpendicular to the page.

In the phase 2 arrangement of the two magnetic field sensing elements, the reference field conductor, which is the same reference field conductor shown in this phase 1 arrangement, carries a current, IREF. As described above in the phase 1 arrangement, the current, IREF, generates magnetic fields at the two magnetic field sensing elements that are in opposite directions. Because the two magnetic field sensing elements in the reference-field-sensing configuration have opposite sensitivities to magnetic fields, in the presence of the current, IREF, a non-zero output signal, referred to herein as a "reference-magnetic-field-responsive signal" is generated by the two magnetic field sensing elements. Thus, when coupled in the phase 2 arrangement, the two magnetic field sensing elements are responsive to a magnetic field generated by the reference field conductor, but are not responsive to a measured (external or normal) magnetic field.

It will become apparent from discussion below that a magnetic field sensor can operate by alternating back and forth between the phase 1 and phase 2 arrangements. It should be apparent that, with this alternating arrangement, the measured-field-sensing configuration is always the same, and thus, there is no chopping of the two Hall elements. Chopping in the measured-field-sensing configuration is described more fully below in conjunction with FIGS. 7 and 10.

Taken together, since they are from the same two magnetic field sensing elements but taken at different times, the measured-magnetic-field-responsive signal and the reference-magnetic-field-responsive signal are referred to herein simply as a "magnetic field signal," which is responsive to magnetic fields.

From figures below it will become apparent that because couplings of the two magnetic field sensing elements, for example the two magnetic field sensing elements of FIG. 6, are alternated back and forth, the magnetic field signal has both the measured-magnetic-field-responsive signal portions responsive to a measured magnetic field when coupled in the measured-field-sensing configuration and reference-magnetic-field-responsive signal portions responsive to a reference magnetic field when coupled in the reference-field-sensing configuration. As further described below, because the measured-field-sensing configuration and the reference-field-sensing configuration occur alternately back-and-forth, by using time division multiplexing, the measured-magnetic-field-responsive signal portions can be separated from the reference-magnetic-field-responsive signal portions in ways described more fully below.

Figure 7:
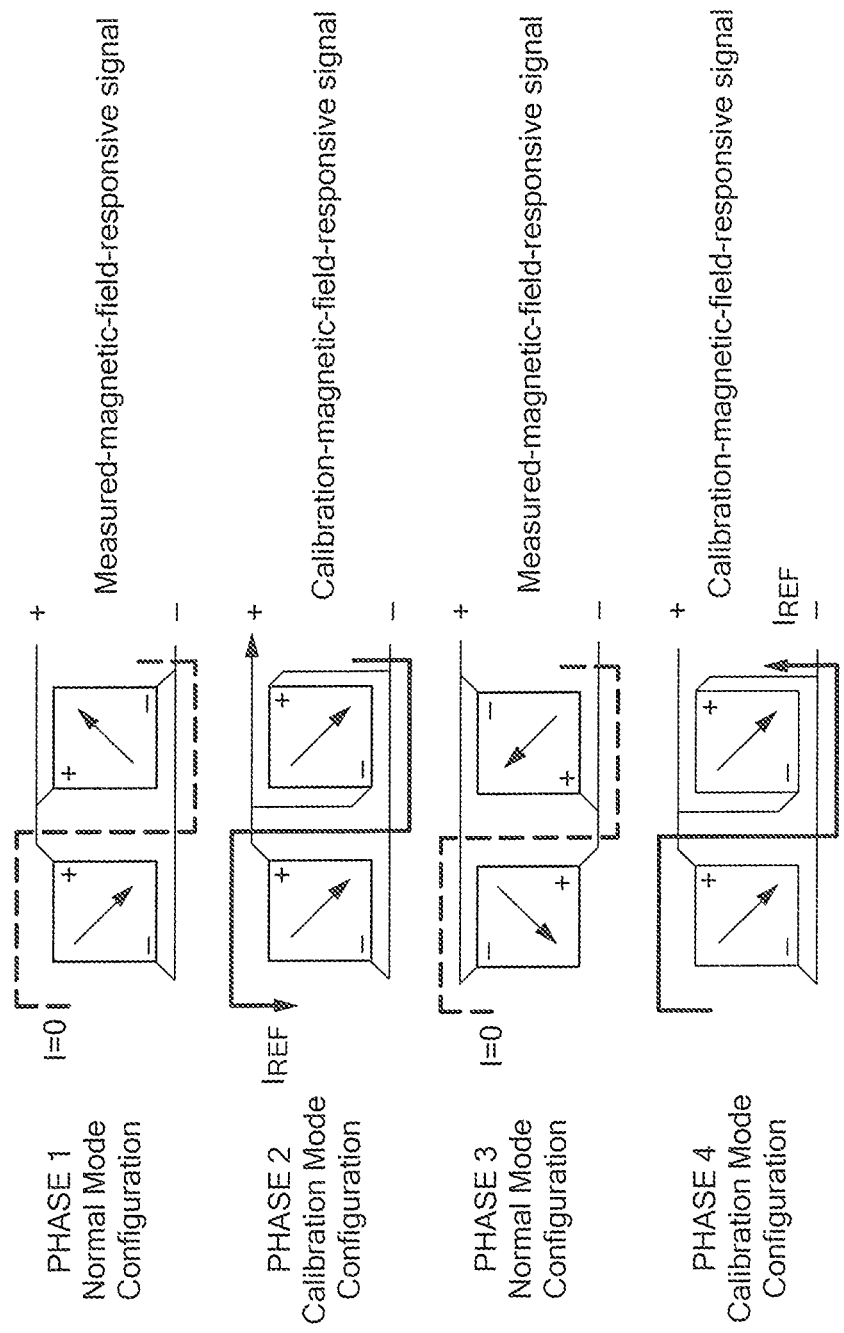
FIG. 7 is a block diagram showing two Hall elements for which couplings are alternated back and forth between a measured-field-sensing configuration and a reference-field-sensing configuration, wherein, when in the measured-field-sensing configuration, the two Hall elements are chopped to achieve two current spinning phases among four repeating configurations.

Referring now to FIG. 7, two magnetic field sensing elements, which are the same two magnetic field sensing elements, are shown in four different phase arrangements, i.e., shown in a time division multiplexed arrangement, two in the measured-field-sensing configuration and two in the reference-field-sensing configuration (a 2× chopping arrangement associated with each configuration). The four different phase arrangements are achieved sequentially and repetitively by way of a switching circuit described more fully below in conjunction with FIG. 12.

Referring first to a phase 1 arrangement, the two magnetic field sensing elements are coupled in the measured-field-sensing configuration, which is the same as or similar to the measured-field-sensing-configuration coupling arrangement described above in conjunction with FIG. 4. As described above, with this coupling arrangement, the two magnetic field sensing elements are responsive to an external magnetic field as may be received from the environment and collectively generate the measured-magnetic-field-responsive signal, responsive to a measured (external) magnetic field.

A reference field conductor is shown as dashed line, the dashed line indicative of no current being carried by the reference field conductor. However, in an alternate embodiment, the reference field conductor can carry a current.

In a phase 2 arrangement, the two magnetic field sensing elements are coupled in the reference-field-sensing configuration, which is the same as or similar to the reference field coupling arrangement described above in conjunction with FIGS. 5 and 5A. From discussion above, it will be understood that the two magnetic field sensing elements are coupled in way such that the two magnetic field sensing elements are responsive in opposite directions to a magnetic field perpendicular to the page.

In the phase 2 arrangement of the two magnetic field sensing elements, the reference field conductor, which is the same reference field conductor shown in this phase 1 arrangement, carries a current, IREF. The current, IREF, generates magnetic fields at the two magnetic field sensing elements that are in opposite directions. Because the two magnetic field sensing elements in the reference-field-sensing configuration have opposite sensitivities to a magnetic field, in the presence of the current, IREF, a non-zero output signal, the reference-magnetic-field-responsive signal, is generated by the two magnetic field sensing elements. In the phase 2 arrangement, the two magnetic field sensing elements are responsive to the magnetic fields generated by the reference field conductor and or not responsive to the measured (external) magnetic field.

In a phase 3 arrangement, the two magnetic field sensing elements are again coupled in the measured-field-sensing configuration. However, the two magnetic field sensing elements are coupled so as to have a reverse polarity from that shown in the phase 1 arrangement. The reverse polarity is representative of the part of the above-described chopping of the two magnetic field sensing elements, described, for example, in conjunction with FIGS. 3-3C.

Different directions of arrows within the Hall elements are representative of different couplings of drive signals (not shown) to a selected two of the terminals of the individual Hall elements. Conventional Hall elements are four terminal devices, wherein two of the terminals are coupled to pass a drive current, and the remaining two terminals provide a differential output signal. It will be recognized that the four terminals can be coupled in at least four different configurations. If an individual Hall element is coupled into two or more of these different configurations and the output signals from the two or more different configurations are arithmetically processed (e.g., summed or otherwise averaged), arithmetically processed signal has less of an offset voltage than the output signal taken at any one of the different configurations. This summing or averaging of output signals associated with different configurations corresponds to the above-mentioned "chopping."

The arrangement of FIG. 7, in particular, the two measured-field-sensing configurations of phase 1 and phase 3, is representative of a 2× chopping of the two Hall elements. Essentially, the measure-magnetic-field-responsive signal portions, which occur at different times, can be arithmetically processed to reduce an offset voltage.

In the phase 3 arrangement of the two magnetic field sensing elements, the reference field conductor, which is the same reference field conductor shown in the phase 1 and phase 2 arrangements, carries no current. However, in an alternate embodiment, the reference field conductor can carry a current. The same as for the phase 1 arrangement, in the phase 3 arrangement, the two magnetic field sensing elements taken collectively are again not responsive to the magnetic field is generated by a current carried by a reference field conductor, but are responsive to an external magnetic field.

In a phase 4 arrangement, the two magnetic field sensing elements are again coupled in the reference-field-sensing configuration.

In the phase 4 arrangement of the two magnetic field sensing elements, the reference field conductor, which is again the same reference field conductor shown in the phase 1, phase 2, and phase 3 arrangements, carries the current, I REF, but in the opposite direction from that which is shown in the phase 2 arrangements. The same as for the phase 2 arrangement, in the phase 4 arrangement, the two magnetic field sensitive elements taken together are responsive to the magnetic fields generated by the current, IREF, and not responsive to an external magnetic field.

Taken together, since they are from the same two magnetic field sensing elements, the measured-magnetic-field-responsive signal and the reference-magnetic-field-responsive signal are referred to herein simply as a "magnetic field signal," which is responsive to magnetic fields.

From figures below it will become apparent that, because couplings of the two magnetic field sensing elements, for example the two magnetic field sensing elements of FIG. 7, are alternated back and forth, the magnetic field signal has both the measured-magnetic-field-responsive signal portions responsive to a measured magnetic field when coupled in the measured-field-sensing configuration and a reference-magnetic-field-responsive signal portions responsive to a reference magnetic field when coupled in the reference-field-sensing configuration. Because the measured-field-sensing configuration and the reference-field-sensing configuration occur alternately back-and-forth, by using time division multiplexing, the measured-magnetic-field-responsive signal portion can be separated from the reference-magnetic-field-responsive signal portion in ways described more fully below.

In some embodiments, in order to achieve a holding of the two time divisions of the measured-magnetic-field-responsive signal portions and a holding of the two time divisions of the reference-magnetic-field-responsive signal portions during times when a selected time division of a signal portion is being used, a filter associated with the unused signal portion, for example, the filter 220 or 226 of FIG. 12 described below, can be temporarily set to have a much reduced bandwidth, resulting in operation similar to sample and hold operation.

Figure 8:
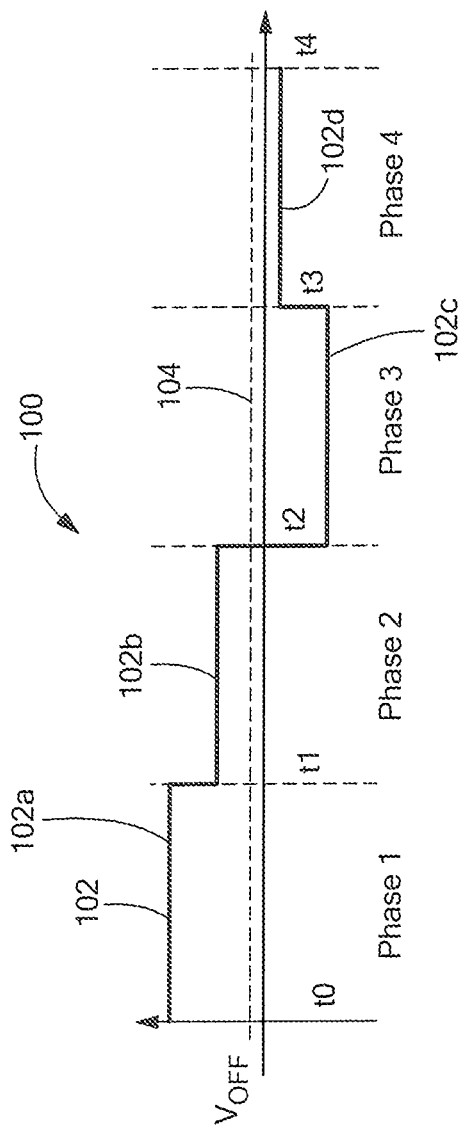
FIG. 8 is a graph showing output signals from the two Hall elements of FIG. 7 and showing the signals during all of the four phases.

Referring now to FIG. 8, the graph 100 includes a horizontal axis with a scale in arbitrary units of time and of vertical axis with a scale in arbitrary units of voltage. A magnetic field signal 102 is representative of a magnetic field signal as may be generated, for example, by the two magnetic field sensing elements described above in conjunction with FIG. 7 during the four phases.

The graph 100 shows four time periods t0-t1, t1-t2, t2-t3, t3-t4. Each one of the time periods t0-t1, t1-t2, t2-t3, t3-t4 corresponds to a respective one of phase 1, phase 2, phase 3, and phase 4 of FIG. 7. The magnetic field signal 102 includes a measured-magnetic-field-responsive signal portion 102a, a reference-magnetic-field-responsive signal portion 102b, a measured-magnetic-field-responsive signal portion 102c, and a reference-magnetic-field-responsive signal portion 102d as may be generated by the two magnetic field sensing elements of FIG. 7 as the two magnetic field sensing elements are sequenced through the four phases, phase 1, phase 2, phase 3, and phase 4.

The two measured-magnetic-field-responsive signal portions 102a, 102c have magnitudes representative of a magnitude of an external magnetic field as may be sensed by the two magnetic field sensing elements, first with a magnitude in one direction in phase 1 and then in the other direction in phase 3 due to the different coupling of drive signals.

The two reference-magnetic-field-responsive signal portions 102b, 102d have magnitudes representative of a magnitude of the reference magnetic field (having two reference magnetic field portions in opposite directions) as may be generated by the current, IREF, passing through the reference field conductor of FIG. 6, first in one direction in phase 2 and then in the other direction in phase 4.

The magnetic field signal 102 has an offset voltage 104. Thus, the two measured-magnetic-field-responsive signal portions 102a, 102c have magnitudes centered about the offset voltage 104. Similarly, the two reference-magnetic-field-responsive signal portions 102b, 102d have magnitudes centered about the offset voltage 104.

It should be understood that the offset voltage 104 is not desirable. By techniques described more fully below, the offset voltage 104 can be removed.

Referring now to FIG. 9, in which like elements of FIG. 8 are shown having like reference designations, a graph 120 has the same horizontal axis and the same vertical axis as those shown in conjunction with FIG. 8. Here however, only the two measured-magnetic-field-responsive signal portions 102a, 102c are shown as could be separated out from the magnetic field signal 102 of FIG. 8 by way of time division multiplexing.

Referring now to FIG. 10, in which like elements of FIG. 8 are shown having like reference designations, a graph 140 has the same horizontal axis and the same vertical axis as those shown in conjunction with FIG. 8. Here however, only the two reference-magnetic-field-responsive signal portions 102b, 102d are shown as could be separated out from the magnetic field signal 102 of FIG. 8 by way of time division multiplexing.

Figure 11:
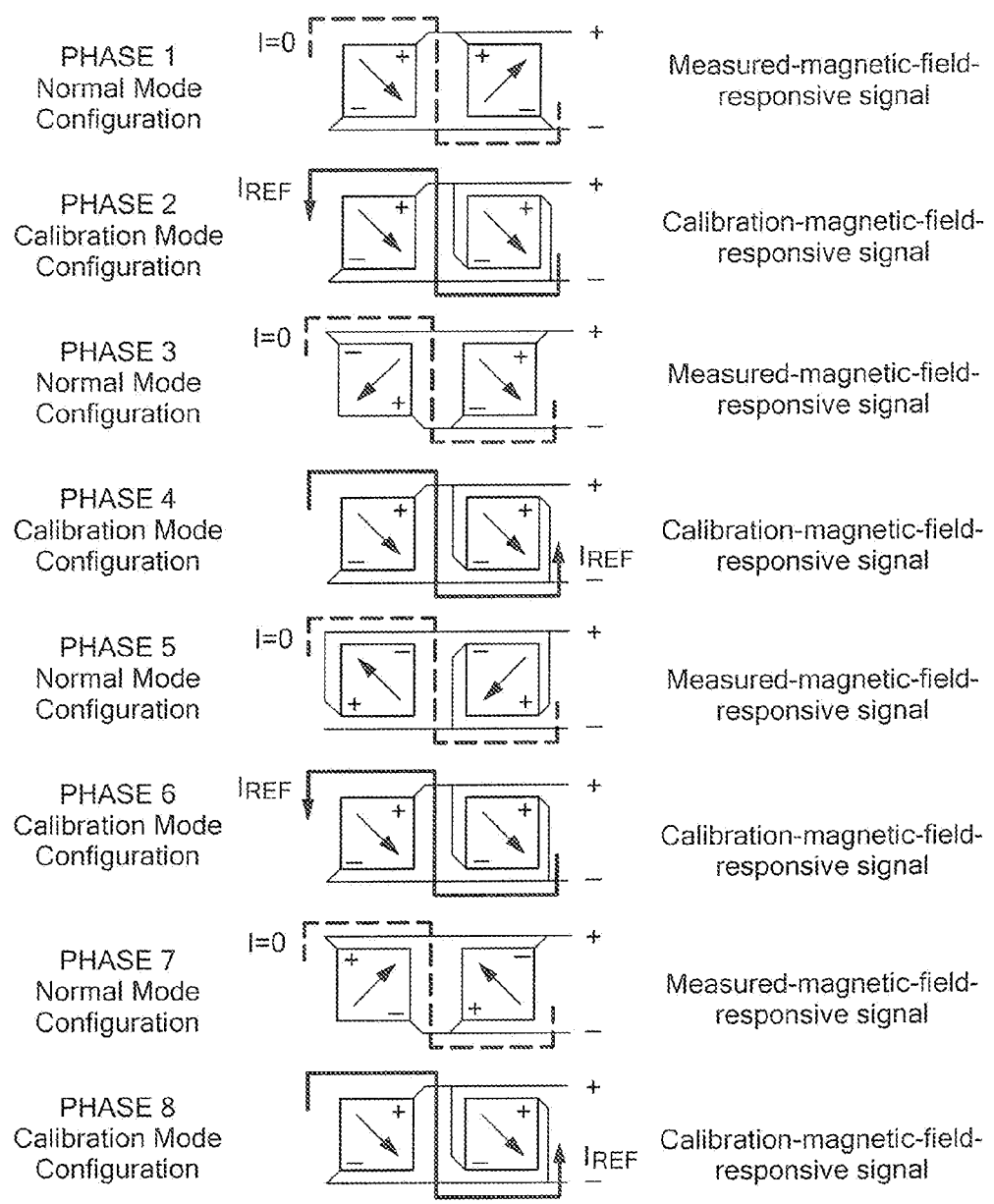
FIG. 11 is a block diagram showing two Hall elements for which couplings are alternated back and forth between the measured-field-sensing configuration and the reference-field-sensing configuration, wherein, measured-field-sensing configuration, the two Hall elements are chopped to achieve four current spinning phases among eight repeating configurations.

Referring now to FIG. 11, two magnetic field sensing elements are again shown in a time division multiplexed arrangement, but here with eight different phases, i.e., couplings of the magnetic field sensing elements and directions of current through a conductor. As with the arrangements of FIGS. 6 and 7, phases phase 1, phase 2, phase 3, phase 4, phase 5, phase 6, phase 7, phase 8 alternate back and forth between having the magnetic field sensing elements coupled in the measured-field-sensing configuration and in the reference-field-sensing configuration (a 4× chopping arrangement associated with each configuration). Here it is shown that the reference current alternates in direction upon every other phase of the two magnetic field sensing elements.

Again, when in the measured-field-sensing configurations of phase 1, phase 3, phase 5, and phase 7, current through the conductor can be turned off, which is represented by dashed lines.

Measured-field-sensing configurations of phase 1, phase 3, phase 5, phase 7 each have a different couplings (e.g., four different couplings) of drive signals (not shown) as represented by different directions of arrows within the two magnetic field sensing elements. In accordance with the four different couplings, it will be recognized that the arrangement shown FIG. 11 is a 4× chopping arrangement and output signals from these four different phases can be summed or otherwise averaged in order to achieve or reduced offset voltage when in the measured-field-sensing configurations.

In some embodiments, in order to achieve a holding of the four time divisions of the measured-magnetic-field-responsive signal portions and a holding of the four time divisions of the reference-magnetic-field-responsive signal portions during times when a selected time division of a signal portion is being used, a filter associated with the unused signal portion, for example, the filter 220 or 226 of FIG. 12 described below, can be temporarily set to have a much reduced bandwidth, resulting in operation similar to sample and hold operation.

While particular time division multiplexed arrangements are described above in conjunction with FIGS. 7 and 11, in other embodiments, other time division multiplexed arrangements can be used. For example, four time divisions of the measured-magnetic-field-responsive signal portion, i.e., four current spinning phases, can be adjacent in time and followed by four time divisions of the reference-magnetic-field-responsive signal portion. In still other embodiments, the reference-magnetic-field-responsive signal portion can be activated by an external signal, for example, by a user, and at other times, the measured-magnetic-field-responsive signal portion can be active.

Figure 12:
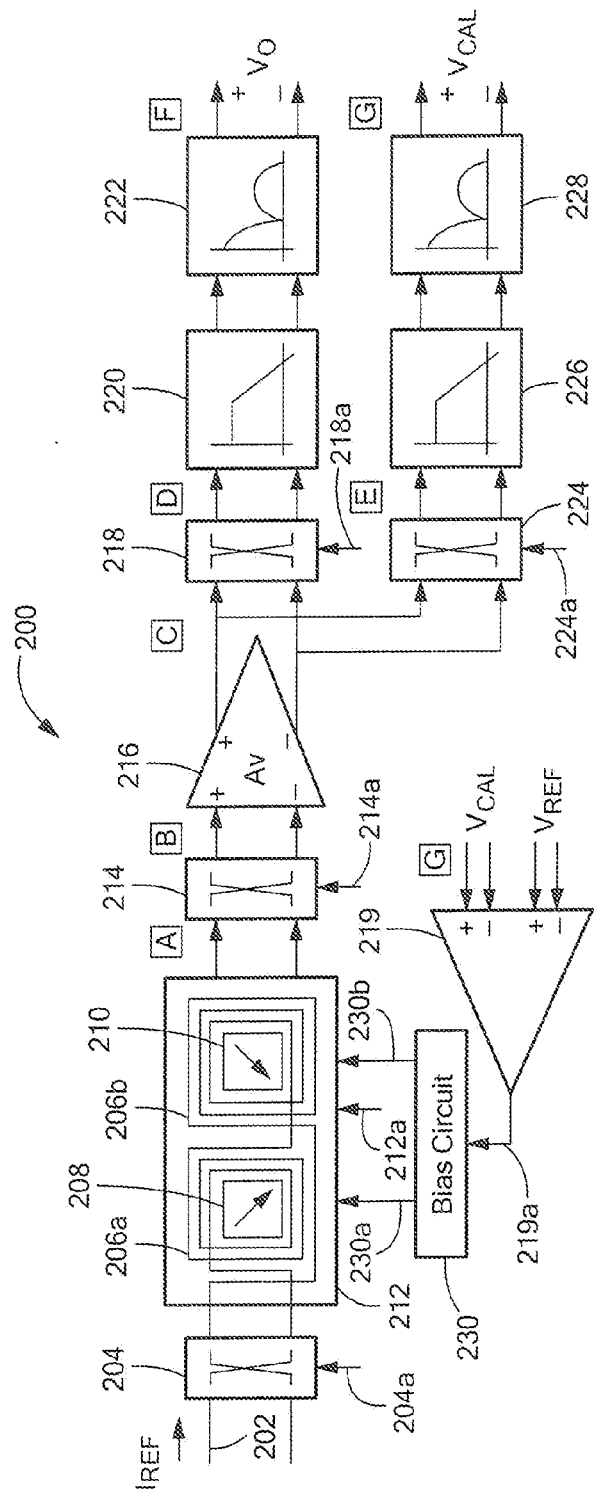
FIG. 12 is a block diagram showing a magnetic field sensor having two Hall elements, a corresponding two reference field conductors, here shown to be coils, and having two electronic channels, a first channel configured to generate an output signal responsive to a measured (normal) magnetic field, and a second channel configured to generate an output signal responsive to the reference magnetic field as generated by the two reference field conductors.

Referring now to FIG. 12, a magnetic field sensor 200 includes two reference field conductors 206a, 206b here shown the form of conductive reference field coils, each reference field coil wound in an opposite direction from the other so as to generate, in response to the current flowing through the two reference field coils, magnetic fields in opposite directions. The two reference field conductors 206a, 206b are coupled in series and coupled to receive a current 202 by way of a switching circuit 204. In response to a control signal 204a, the switching circuit 204 is operable to periodically reverse a direction of the current 202 passing through the two reference field conductors 206a, 206b.

The magnetic field sensor 200 also includes two magnetic field sensing elements 208, 210, here shown in the form of two Hall elements. The two magnetic field sensing elements 206, 208 are coupled in a switching circuit 212. While two Hall elements 208, 210 are shown, in other embodiments, similar circuits and functionality could be achieved with two or more magnetoresistance elements.

In response to a control signal 212a, the switching circuit 212 is operable to couple the two magnetic field sensing elements 208, 210 back and forth into the measured-field-sensing configuration and into the reference-field-sensing configuration shown above in conjunction with FIGS. 6, 7, and 11. The switching back and forth can have no chopping when in the measured-field-sensing-configuration as represented in FIG. 6, a 2× chopping when in the measured-field-sensing configuration as represented in FIG. 7, a 4× chopping when in the measured-field-sensing configuration as represented in FIG. 11, or other chopping arrangements.

A magnetic field signal, which can be a differential magnetic field signal, is identified by a box labeled A. As described above, the magnetic field signal at the box labeled A can include both a measured-magnetic-field-responsive signal portion responsive to a measured magnetic field (and not responsive to a reference magnetic field) when coupled in the measured-field-sensing configuration, and a reference-magnetic-field-responsive signal portion responsive to the reference magnetic field (and not responsive to the measured magnetic field) when coupled in the reference-field-sensing configuration. The two signal portions can occur periodically and alternately, for example, as described above in conjunction with FIG. 6, 7, or 11.

A switching circuit (a modulator) 214 is coupled to receive the differential signal, i.e., the magnetic field signal at the box labeled A, and configured to generate a switched signal, shown to be a differential signal, identified by a box labeled B. It should be understood that the switching circuit 214 in combination with the switching circuit 212 provides the full chopping of the two Hall elements 208, 210, and the switching circuits 214, 212 are comparable to the switches 80*a*-80*d* and 76*a*-76*d*, respectively, of FIG. 3. However, unlike the arrangement of FIGS. 3-3C, which shows 2× chopping, the switching circuits 212, 214 of FIG. 12 are representative of 4× chopping as shown, for example, in FIG. 11.

The switching circuit 214 is coupled to receive a control signal 214*a*. An amplifier 216 is coupled to receive the switched signal at the box labeled B and is configured to generate an amplified signal, shown to be at differential signal, identified by a box labeled C.

In part of a first circuit channel, i.e., a measured-field-sensing channel, a switching circuit (a modulator) 218 is coupled to receive the differential signal at the box labeled C and configured to generate a switched signal, shown to be a differential signal, identified by a box labeled D.

In a further part of the first circuit channel, a filter circuit 220 is coupled to receive the differential signal at the box labeled D and configured to generate a filtered signal received by another filter circuit 222. The filter circuit 222 can be configured to generate an output signal, shown to be a differential signal, identified by box labeled F. The output signal at the box labeled F can be the above-described measured-magnetic-field-responsive signal.

In part of a second circuit channel, i.e., a reference-field-sensing channel, a switching circuit (a modulator) 224 is coupled to receive the differential signal at the box labeled C and configured to generate a switched signal, shown to be a differential signal, identified by box labeled E.

In a further part of the second circuit channel, a filter circuit 226 is coupled to receive the differential signal at the box labeled E and configured to generate a filtered signal received by another filter circuit 228. The filter circuit 228 can be configured to generate an output signal, shown to be a differential signal, identified by a box labeled G. The signal at the box labeled G can be the above-described reference-magnetic-field-responsive signal.

The output signals at the boxes labeled F and G, i.e., the measured-magnetic-field-responsive signal portion and the reference-magnetic-field-responsive signal portion, can occur back and forth repetitively and periodically.

The magnetic field sensor 200 can also include an amplifier 219 coupled to receive the output signal at the box labeled G, i.e., the reference-magnetic-field-responsive signal, coupled to receive a reference signal, VREF, and configured to generate an error signal 219*a*. A bias circuit can be coupled to receive the error signal 219*a* and configured to generate bias signals 230*a*, 230*b*, which, in some embodiments, can be current signals, configured to drive and pass through two terminals of each respective one of the two Hall elements 208, 210 by way of the switching circuit 212.

In operation, the error signal 219*a* controls a magnitude of the bias signals 230*a*, 230*b*. An output signal at the box labeled G that is too large relative to the reference signal, VREF, results in a reduction of the bias signals 230*a*, 230*b*. Thus, an effective gain or sensitivity of the magnetic field sensor 200 is controlled in relation to the reference voltage, VREF.

In some alternate embodiments, the error signal 219*a* instead controls a gain of the amplifier 216. One such arrangement is described below in conjunction with FIG. 25.

In some other alternate embodiments, the amplifier 219 is not used, and instead the output signal at the box labeled G is received by and used by another processor (not shown) to adjust a magnitude of a signal related to the output signal, F.

Figure 13:
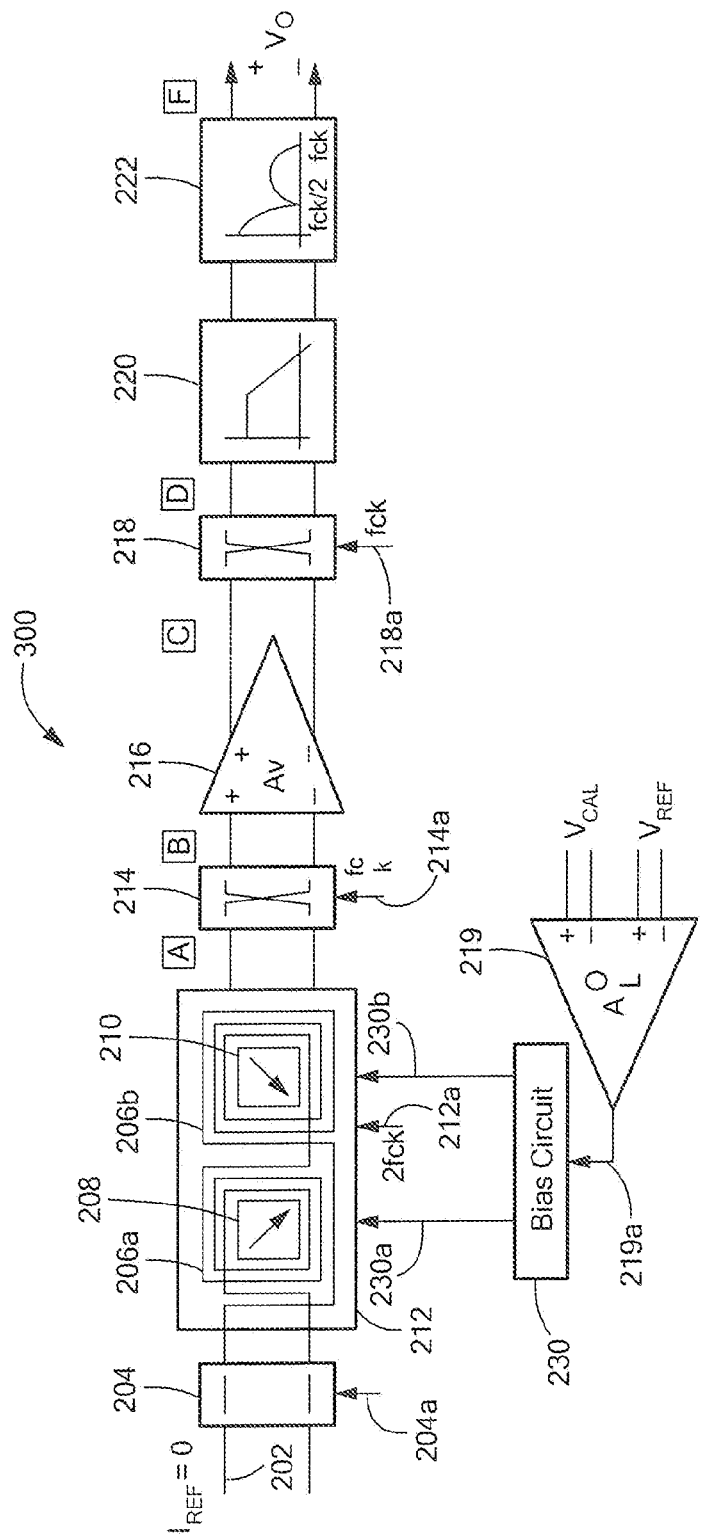
FIG. 13 is a block diagram showing a portion of the magnetic field sensor of FIG. 12, and, in particular, showing the first channel and not showing the second channel of FIG. 12.

Further operation of the magnetic field sensor 200 is described below in conjunction with FIGS. 13-24. In particular, FIG. 13 shows the magnetic field sensor 200 of FIG. 12 when the two magnetic field sensing elements 208, 210 are coupled repetitively and periodically in the measured-field-sensing configuration, for example, the 2× chopping arrangement corresponding to FIG. 7. Similarly, FIG. 19 shows the magnetic field sensor 200 of FIG. 12 when the two magnetic field sensing elements 208, 210 are coupled repetitively and periodically, for example, in the reference-field-sensing configuration of FIG. 7.

In embodiments of the magnetic field sensor 200, when coupled in the measured-field-sensing configuration, the switching circuit 212 can generate two-phase chopping, four-phase chopping, or another chopping arrangement in accordance with the above-described offset modulation. As described above, offset modulation operates to shift offset signal components to a higher frequency, while leaving external magnetic field signal components at baseband.

In other embodiments of the magnetic field sensor 200, when coupled in the measured-field-sensing configuration, the switching circuit 212 can generate two-phase chopping, four-phase chopping, or another chopping arrangement in accordance with the above-described signal modulation. As described above, signal modulation operates to shift external magnetic field signal components to a higher frequency, while leaving offset signal components at baseband. In signal modulation arrangements, the switching circuit 214 can be omitted, or alternately, another switching circuit (not shown) can be coupled between the switching circuit 212 and the switching circuit 214.

Referring now to FIG. 13, in which like elements of FIG. 12 are shown having like reference designations, a portion 300 of the magnetic field sensor 200 of FIG. 12 but having only the first channel, which generates the measured-magnetic-field-responsive signal at the box labeled F is shown.

When the two magnetic field sensing elements 208, 210 are coupled in the measured-field-sensing configuration repetitively and periodically, the switching circuit 204 can be coupled into any configuration. Here is shown that the switching circuit 204 does not switch, meaning that the switching circuit 204 is a pass-through each time that the two magnetic field sensing elements 208, 210 are coupled into the measured-field-sensing configuration by the switching circuit 212.

Also, when in the measured-field-sensing configuration, the current 202 through the two reference field coils 206*a*, 206*b* can be set to zero. It will be understood from discussion above that, when the two magnetic field sensing elements 208, 210 are coupled in the measured-field-sensing configuration, taken together they are responsive to magnetic fields in the same direction and not to magnetic fields as would be generated in opposite directions by the two reference field coils 206*a*, 206*b*. Thus the current 202 can be set to zero in order to conserve power.

The switching circuit 214 is shown by way of the switching symbol inside of the switching circuit 214 to be switching, meaning, that upon each occurrence of the measured-field-sensing configuration coupling of the two magnetic field sensing elements 208, 210 by the switching circuit 212, the switching circuit 214 reverses couplings between the two magnetic field sensing elements 208, 210 and the amplifier 216. This results in a frequency shift of certain components of the magnetic fields signal at the box labeled A further described below.

The switching circuit 218 is also shown by way of the switching symbol inside of the switching circuit 218 to be switching, again meaning, that upon each occurrence of the measured-magnetic-field-configuration couplings of the two magnetic field sensing elements 208, 210 by the switching circuit 212, the switching circuit 218 reverses couplings between amplifier 216 and the filter circuit 220. This also results in another frequency shift of components of the amplified signal at the box labeled C as further described below.

As indicated, the control signals 214a, 218a switch the respective switching circuits 214, 218 with a switching rate of fck. In contrast, the switching circuit 212 switches with the switching rate of 2fck, meaning that the switching circuit 212 achieves the measured-field-sensing configuration of the two magnetic field sensing elements 208, 210 on every other clock cycle of the control signal 212a.

FIGS. 14-18 show frequency domain graphs of the signals, at the boxes labeled A, B, C, D, and F, that occur within the portion 300 of the magnetic field sensor 200 with the two magnetic field sensing elements 208, 210 coupled repetitively and periodically in the measured-field-sensing configuration. In particular, FIGS. 14-18 are representative of the 4× chopping of FIG. 11 for the measured-field-sensing configuration.

Figure 14:
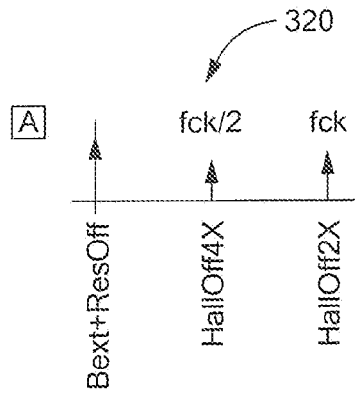
FIGS. 14-18 are graphs showing frequency spectra at various points of the magnetic field sensor portion of FIG. 13.

Referring now to FIG. 14, a graph 320 has a horizontal axis with a scale in arbitrary units of frequency and a vertical axis with a scale in arbitrary units of magnitude. The graph 320 includes three spectral lines when in the presence of a stationary, i.e. non-varying, magnetic field. The magnetic field is a sensed or external magnetic field.

The graph 320 is representative of the magnetic field signal at the box labeled A associated with the magnetic field sensor portion 300 of FIG. 13, i.e. the magnetic field signal at the box labeled A taken when the magnetic field sensing elements 208, 210 are repetitively and periodically coupled in the measured-field-sensing configuration. The graph 320 is indicative of the above-described four phase offset modulation by the switching circuit 212.

A first spectral line (left) occurs at DC and has a magnitude corresponding to a magnitude, Bext, of the external, or sensed, magnetic field plus an undesirable residual offset voltage (after chopping) generated by the two magnetic field sensing elements 208, 210 of FIG. 13.

A second spectral line occurs at a frequency of fck/2 and results from the 4× chopping described above.

A third spectral line occurs at a frequency of fck and also results from the 4× chopping described above. Essentially, the 4× chopping can be considered as two 2× choppings one right after the other, and thus, the spectral line at the frequency of fck is like that which would occur if 2× chopping were used.

Figure 15:
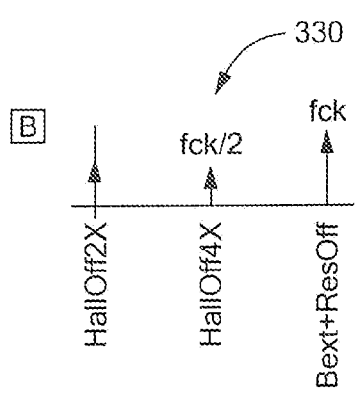

Referring now to FIG. 15, a graph 330 has a horizontal axis with a scale in arbitrary units of frequency and a vertical axis with a scale in arbitrary units of magnitude. The graph 330 includes three spectral lines when in the presence of a stationary, i.e. non-varying, magnetic field. The magnetic field is a sensed or external magnetic field.

The graph 330 is representative of the magnetic field signal at the box labeled B associated with the magnetic field sensor portion 300 of FIG. 13 taken when the magnetic field sensing elements 208, 210 are repetitively and periodically coupled in the measured-field-sensing configuration.

As can be seen, by operation of the switching circuit 214 of FIGS. 12 and 13, frequencies have been shifted.

A first spectral line (left) occurs at DC and has a magnitude related to the magnitude of the third spectral line of FIG. 14.

A second spectral line occurs at a frequency of fck/2 and has a magnitude related to the magnitude of the second spectral line of FIG. 14.

A third spectral line occurs at a frequency of fck and has a magnitude related to the magnitude of the first spectral line of FIG. 14, corresponding to the magnitude, Bext, of the external, or sensed, magnetic field plus the undesirable residual offset voltage (after chopping) generated by the two magnetic field sensing elements 208, 210 of FIG. 13.

Figure 16:
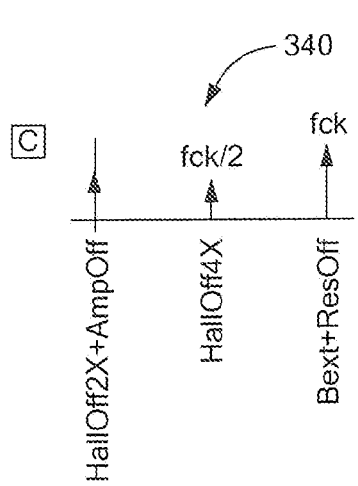

Referring now to FIG. 16, a graph 340 has a horizontal axis with a scale in arbitrary units of frequency and a vertical axis with a scale in arbitrary units of magnitude. The graph 340 includes three spectral lines when in the presence of a stationary, i.e. non-varying, magnetic field. The magnetic field is a sensed or external magnetic field.

The graph 340 is representative of the magnetic field signal at the box labeled C associated with the magnetic field sensor portion 300 of FIG. 13 taken when the magnetic field sensing elements 208, 210 are repetitively and periodically coupled in the measured-field-sensing configuration.

As can be seen, the amplifier 216 adds an offset component, AmpOff, to the first spectral line of FIG. 15 appearing at DC. Otherwise, the three spectral lines of FIG. 16 are the same as those of FIG. 15, but scaled according to a gain of the amplifier 216.

Figure 17:
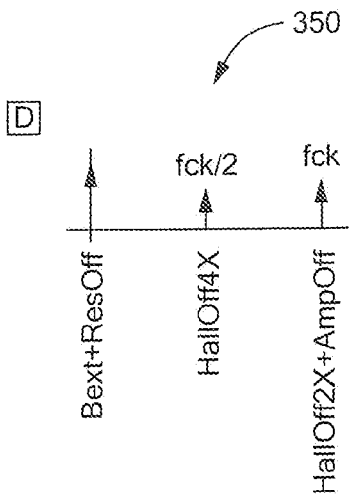

Referring now to FIG. 17, a graph 350 has a horizontal axis with a scale in arbitrary units of frequency and a vertical axis with a scale in arbitrary units of magnitude. The graph 350 includes three spectral lines when in the presence of a stationary, i.e. non-varying, magnetic field. The magnetic field is a sensed or external magnetic field.

The graph 350 is representative of the magnetic field signal at the box labeled D associated with the magnetic field sensor portion 300 of FIG. 13 taken when the magnetic field sensing elements 208, 210 are repetitively and periodically coupled in the measured-field-sensing configuration.

As can be seen, by operation of the switching circuit 218 of FIGS. 12 and 13, frequencies have been shifted.

A first spectral line (left) occurs at DC and has a magnitude related to the magnitude of the third spectral line of FIG. 16, corresponding to the magnitude, Bext, of the external, or sensed, magnetic field plus the undesirable residual offset voltage (after chopping) generated by the two magnetic field sensing elements 208, 210 of FIG. 13.

A second spectral line occurs at a frequency of fck/2 and has a magnitude related to the magnitude of the second spectral line of FIG. 16.

A third spectral line occurs at a frequency of fck and has a magnitude related to the magnitude of the first spectral line of FIG. 16.

Figure 18:
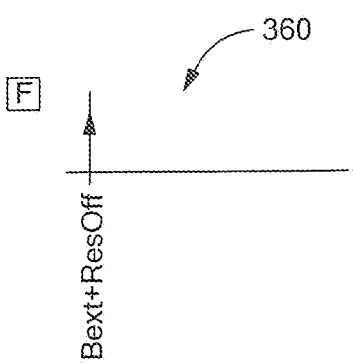
Figure 19:
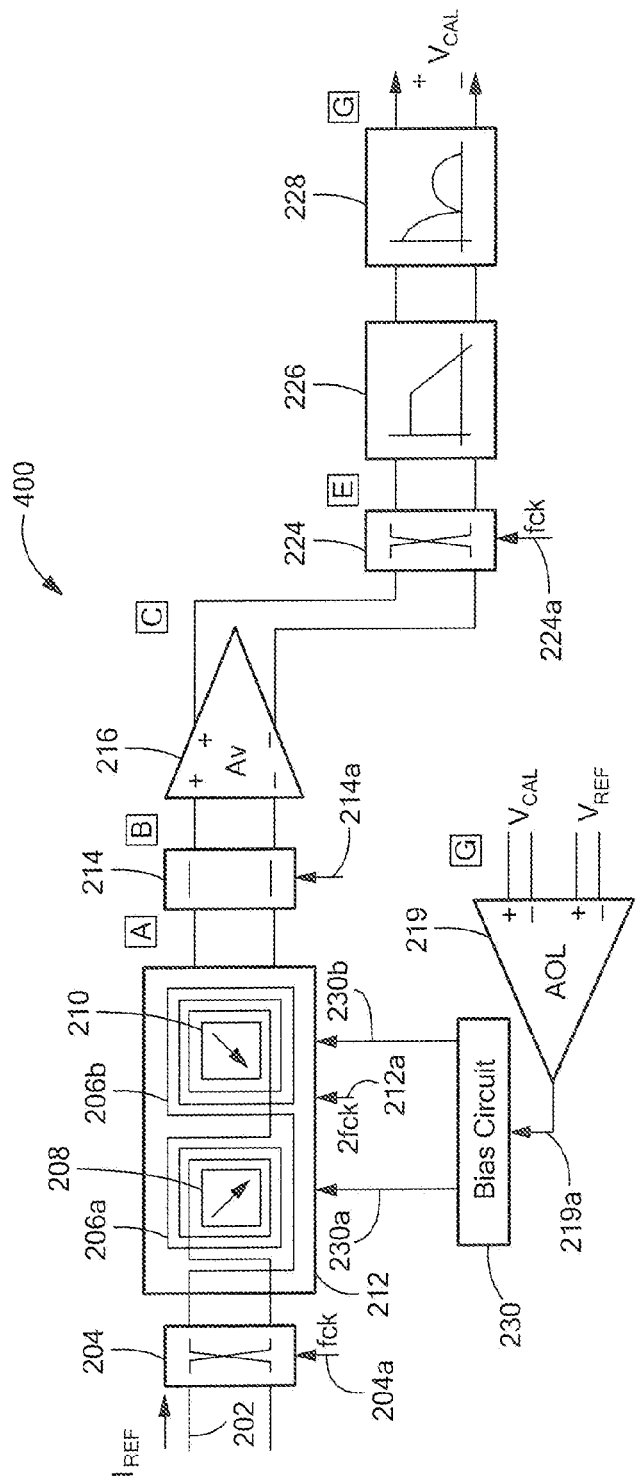
FIG. 19 is a block diagram showing another portion of the magnetic field sensor of FIG. 12, and, in particular, showing the second channel and not showing the first channel of FIG. 12.

Referring now to FIG. 18, a graph 360 has a horizontal axis with a scale in arbitrary units of frequency and a vertical axis with a scale in arbitrary units of magnitude. The graph 360 includes one spectral line when in the presence of a stationary, i.e. non-varying, magnetic field. The magnetic field is a sensed or external magnetic field.

The graph 360 is representative of the magnetic field signal at the box labeled F associated with the magnetic field sensor portion 300 of FIG. 13 taken when the two magnetic field sensing elements 208, 210 are repetitively and periodically coupled in the measured-field-sensing configuration.

As can be seen, by operation of the filter circuits 220, 222 of FIGS. 12 and 13, some spectral components of FIG. 17 have been removed, leaving only the a spectral line at DC having a magnitude corresponding to the magnitude, Bext, of the external, or sensed, magnetic field plus the undesirable residual offset voltage, ResOff, (after chopping) generated by the two magnetic field sensing elements 208, 210 of FIG. 13. The spectral line of FIG. 18 is representative of the above-described measured-magnetic-field-responsive signal.

Referring now to FIG. 19, in which like elements of FIG. 12 are shown having like reference designations, a portion 400 of the magnetic field sensor 200 of FIG. 12 but having only the second channel, which generates the reference-magnetic-field-responsive signal at the box labeled G includes elements shown.

When the two magnetic field sensing elements 208, 210 are coupled in the reference-field-sensing configuration repetitively and periodically, the switching circuit 204 switches to reverse a direction of the current 202 each time that the two magnetic field sensing elements 208, 210 are coupled into the reference-field-sensing configuration by the switching circuit 212.

When in the reference-field-sensing configuration, the current 202 through the two reference field coils 206a, 206b can be set to the value of IREF. It will be understood from discussion above that when the two magnetic field sensing elements 208, 210 coupled in the reference-field-sensing configuration, taken together they are responsive to magnetic fields in opposite directions as would be generated in opposite directions by the two reference field coils 206a, 206b, and not to a magnetic field in the same direction as would be an external or sensed magnetic field.

The switching circuit 214 is shown to not be switching, meaning, that upon each occurrence of the reference-field-sensing configuration coupling of the two magnetic field sensing elements 208, 210 by the switching circuit 212, the switching circuit 214 merely passes the magnetic field signal at the box labeled A to the amplifier 216 as the signal at the box labeled B without switching. This results in no frequency shift of components of the magnetic fields signal at the box labeled A further described below.

In contrast, the switching circuit 224 is shown by way of the switching symbol inside of the switching circuit 224 to be switching, meaning, that upon each occurrence of the reference-field-sensing configuration couplings of the two magnetic field sensing elements 208, 210 by the switching circuit 212, the switching circuit 218 reverses couplings between amplifier 216 and the filter circuit 226. This results in a frequency shift of components of the amplified signal at the box labeled C as further described below.

As indicated, the control signals 204a, 224a switch the respective switching circuits 204, 224 with a switching rate of fck. In contrast, the switching circuit 212 switches with the switching rate of 2fck, meaning that the switching circuit 212 achieves the reference-field-sensing configuration of the two magnetic field sensing elements 208, 210 on every other clock cycle of the control signal 212a, and the measured-field-sensing configuration on other ones of the clock cycles.

FIGS. 20-24 show frequency domain graphs of the signals at the boxes labeled A, B, C, E, and G, that occur within the portion 400 of the magnetic field sensor 200 with the two magnetic field sensing elements 208, 210 coupled repetitively and periodically in the reference-field-sensing configuration. In particular, FIGS. 20-24 are representative of the 4× chopping of FIG. 11 for the reference-field-sensing configuration.

Figure 20:
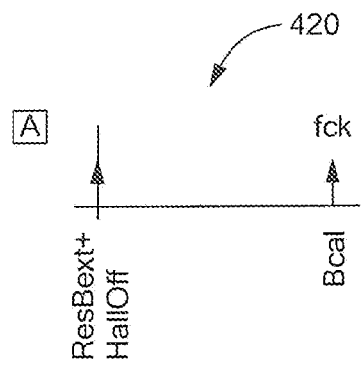
FIGS. 20-24 are graphs showing frequency spectra at various points of the magnetic field sensor portion of FIG. 19.

Referring now to FIG. 20, a graph 420 has a horizontal axis with a scale in arbitrary units of frequency and a vertical axis with a scale in arbitrary units of magnitude. The graph 420 includes two spectral lines when in the presence of a periodically reversing reference magnetic field generated by the periodic reversal of the current 202 by operation of the switching circuit 204.

The graph 420 is representative of the magnetic field signal at the box labeled A associated with the magnetic field sensor portion 400 of FIG. 19, i.e. the magnetic field signal at the box labeled A taken when the magnetic field sensing elements 208, 210 are repetitively and periodically coupled in the reference-field-sensing configuration, and without the above-described chopping.

A first spectral line (left) occurs at DC and has a magnitude corresponding to a magnitude of a residual sensitivity to the external or sensed magnetic field, ResBext, plus an undesirable offset voltage (no chopping) generated by the two magnetic field sensing elements 208, 210 of FIG. 19.

A second spectral line occurs at a frequency of fck and has a magnitude, Bcal, corresponding to a magnitude of the reference magnetic field generated by the two reference field coils 206a, 206b. This spectral line has already been shifted to the frequency fck by operation of the switching of the switching circuit 204.

Figure 21:
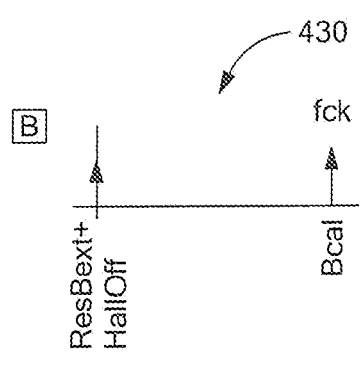

Referring now to FIG. 21, a graph 430 has a horizontal axis with a scale in arbitrary units of frequency and a vertical axis with a scale in arbitrary units of magnitude. The graph 430 includes two spectral lines when in the presence of the periodically reversing reference magnetic field generated by the periodic reversal of the current 202 by operation of the switching circuit 204.

The graph 430 is representative of the magnetic field signal, B, associated with the magnetic field sensor portion 400 of FIG. 19 taken when the magnetic field sensing elements 208, 210 are repetitively and periodically coupled in the reference-field-sensing configuration.

Since the switching circuit 214 of FIGS. 12 and 19 merely acts as a pass through when the two magnetic field sensing elements 208, 210 are coupled in the reference-field-sensing configuration, the graph 430 has the same spectral lines as the graph 420 of FIG. 20.

Figure 22:
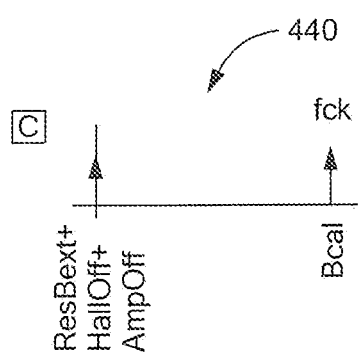

Referring now to FIG. 22, a graph 440 has a horizontal axis with a scale in arbitrary units of frequency and a vertical axis with a scale in arbitrary units of magnitude. The graph 440 includes two spectral lines when in the presence of a periodically reversing reference magnetic field generated by the periodic reversal of the current 202 by operation of the switching circuit 204.

The graph 440 is representative of the magnetic field signal at the box labeled C associated with the magnetic field sensor portion 400 of FIG. 19 taken when the magnetic field sensing elements 208, 210 are repetitively and periodically coupled in the reference-field-sensing configuration.

As can be seen, the amplifier 216 adds an offset component, AmpOff, to the spectral line of FIG. 21 appearing at DC. Otherwise, the two spectral lines of FIG. 22 are the same as those of FIG. 21, but scaled according to a gain of the amplifier 216.

Figure 23:
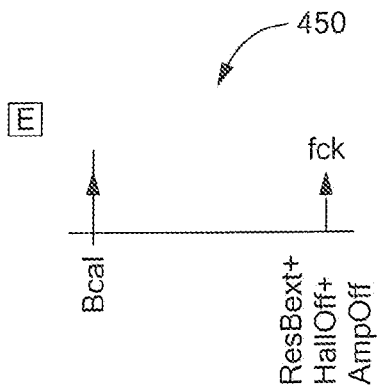

Referring now to FIG. 23, a graph 450 has a horizontal axis with a scale in arbitrary units of frequency and a vertical axis with a scale in arbitrary units of magnitude. The graph 450 includes two spectral lines when in the presence of a periodically reversing reference magnetic field generated by the periodic reversal of the current 202 by operation of the switching circuit 204.

The graph 450 is representative of the magnetic field signal at the box labeled E associated with the magnetic field sensor portion 400 of FIG. 19 taken when the magnetic field sensing elements 208, 210 are repetitively and periodically coupled in the reference-field-sensing configuration.

As can be seen, by operation of the switching circuit 224 of FIGS. 12 and 19, frequencies have been shifted.

A first spectral line (left) occurs at DC and has a magnitude, Bcal, related to the magnitude of the second spectral line of FIG. 22 and corresponding to the magnitude of the reference magnetic field generated by the two reference field coils 206a, 206b. This spectral line is shifted to DC by operation of the switching circuit 224.

A second spectral line occurs at a frequency of $f_c$ k and has a magnitude related to the magnitude of the first, DC, spectral line of FIG. 22.

Figure 24:
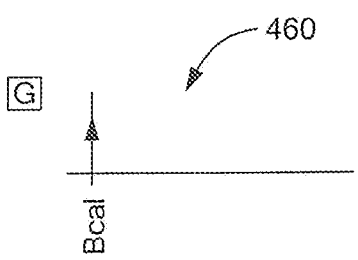

Referring now to FIG. 24, a graph 460 has a horizontal axis with a scale in arbitrary units of frequency and a vertical axis with a scale in arbitrary units of magnitude. The graph 460 includes one spectral line.

The graph 460 is representative of the magnetic field signal at the box labeled G associated with the magnetic field sensor portion 400 of FIG. 19 taken when the magnetic field sensing elements 208, 210 are repetitively and periodically coupled in the reference-field-sensing configuration.

As can be seen, by operation of the filter circuits 226, 228 of FIGS. 12 and 19, other spectral components of FIG. 23 have been removed, leaving only the a spectral line at DC having a magnitude corresponding to the magnitude, Bcal, of the reference magnetic field. The spectral line of FIG. 23 is representative of the above-described reference-magnetic-field-responsive signal.

While circuits and techniques may be described herein in terms of calibration of the magnetic field sensor, it should be understood that the same techniques can be used to provide a self-test of the magnetic field sensor. Namely, the reference-magnetic-field-responsive signal portion at the box labeled G of FIGS. 12 and 19 can be examined, for example, by another processor, to identify if the signal is within acceptable limits.

Figure 25:
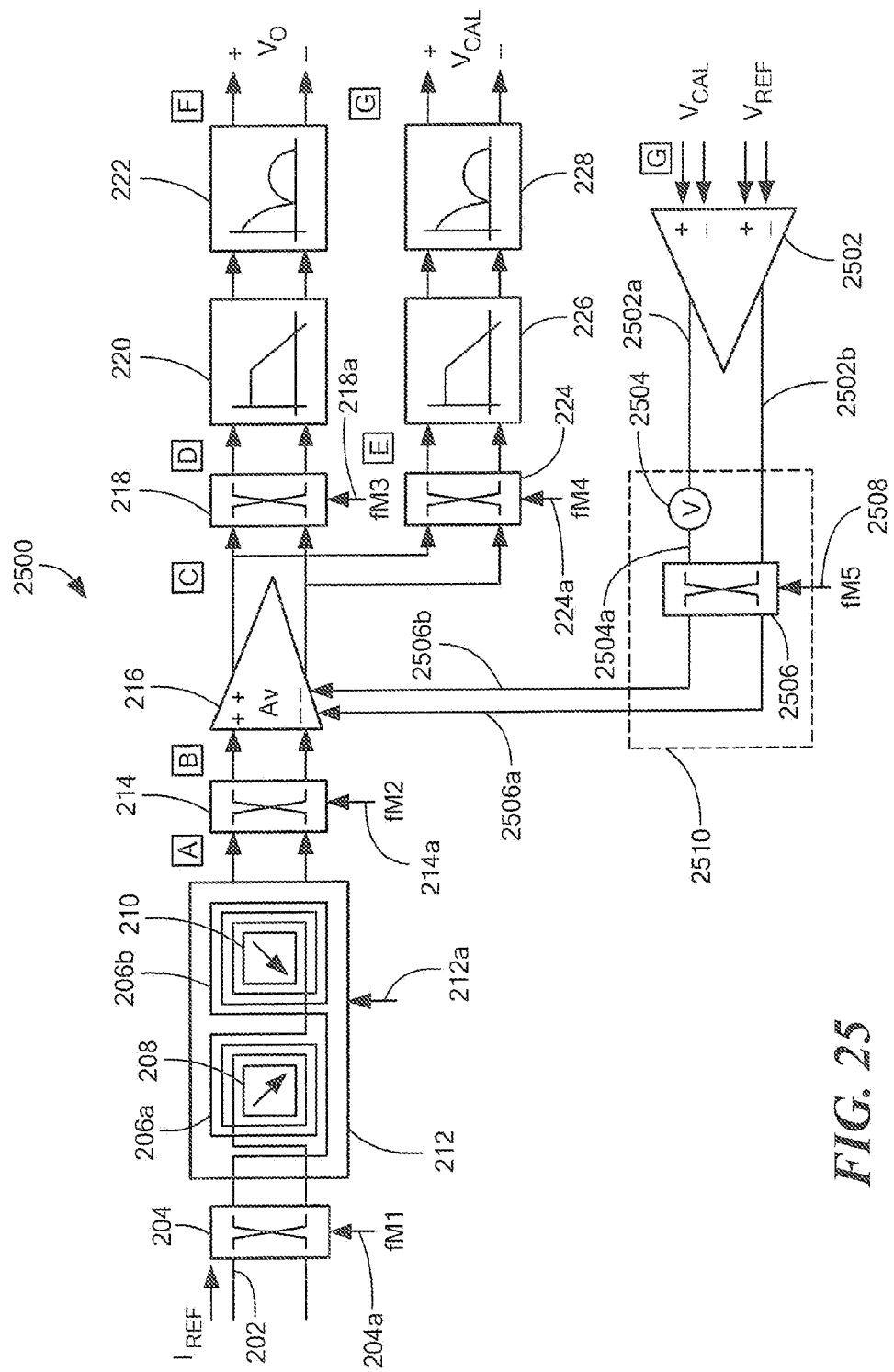
FIG. 25 is a block diagram showing a magnetic field having two Hall elements coupled together, a corresponding two reference field conductors, here shown to be coils, and having two electronic channels, a first channel configured to generate an output signal responsive to a measured (normal) magnetic field, and a second channel configured to generate an output signal responsive to the reference magnetic field as generated by the two reference field conductors, the magnetic field sensor also having a feedback arrangement to calibrate a sensitivity of the magnetic field sensor.

Referring now to FIG. 25, in which like elements of FIG. 12 are shown having like reference designations, a magnetic field sensor 2500 includes a different feedback path than the magnetic field sensor 200 of FIG. 12, which is operable to adjust a sensitivity of the magnetic field sensor 2500 (i.e., to calibrate the magnetic field sensor 2500) in a different way than the amplifier 219 and bias circuit 230 of FIG. 12, and with different capabilities.

The different feedback path of the magnetic field sensor 2500 can include an amplifier 2502 (also referred to herein as an error amplifier) coupled to receive a calibration signal at the box labeled G, i.e., the reference-magnetic-field-responsive signal, coupled to receive a reference signal, VREF, and configured to generate a differential error signal 2502a, 2502b (also referred to herein as a comparison signal).

Shown for explanation purposes herein, a voltage source 2504 can be shown to be disposed in series with one leg of the differential error signal 2502a, 2502b, here shown in series with the error signal 2502a. The voltage source 2504 can generate a signal 2504a offset in voltage from the error signal 2502a.

It is intended herein that the voltage source 2504 be representative of an error in the feedback path, from whatever source it may come. For example, error in the feedback path may be within the amplifier 2502, within the amplifier 216, or within other elements of the feedback path. It will become apparent from discussion below that the feedback path is operable to control a gain of the amplifier 216, and thus, the voltage source 2504 is indicative of an error in the gain of the amplifier.

A switching circuit (a modulator) 2506 is coupled to receive the signal 2504a and the signal 2502b. The switching circuit 2506 is also coupled to receive a clock signal 2506, fM5. The switching circuit 2506 is operable to generate a switched signal (i.e., a modulated signal), shown to be a differential switched signal 2506a, 2506b.

The amplifier 216 is operable to provide a gain of the amplifier 216 in accordance with a value of the differential switched signal 2506a, 2506b.

The switching circuits 212, 214, 218, 224, 2506 are also referred to herein as respective modulators.

In FIGS. 14-18 and FIGS. 20-24 above, operation of the magnetic field sensor 200 of FIG. 12 is described in frequency domain graphs. However, operation of the magnetic field sensor 2500 of FIG. 25, and, in particular, operation of the switching circuit 2506, is more clearly understood from graphs in the time domain. Thus, time domain graphs are described below in conjunction with FIGS. 26-36.

While a particular calibration signal is shown to be generated at the box labeled G using circuits and techniques described above, other arrangements can be used to generate a calibration signal for the purposes of FIGS. 25-36 herein. FIGS. 25-36 are intended instead to describe a removal of a gain error associated with the amplifier 216, no matter what arrangement is used to generate the calibration signal at the box labeled G and also no matter the source of the gain error.

Figure 26:
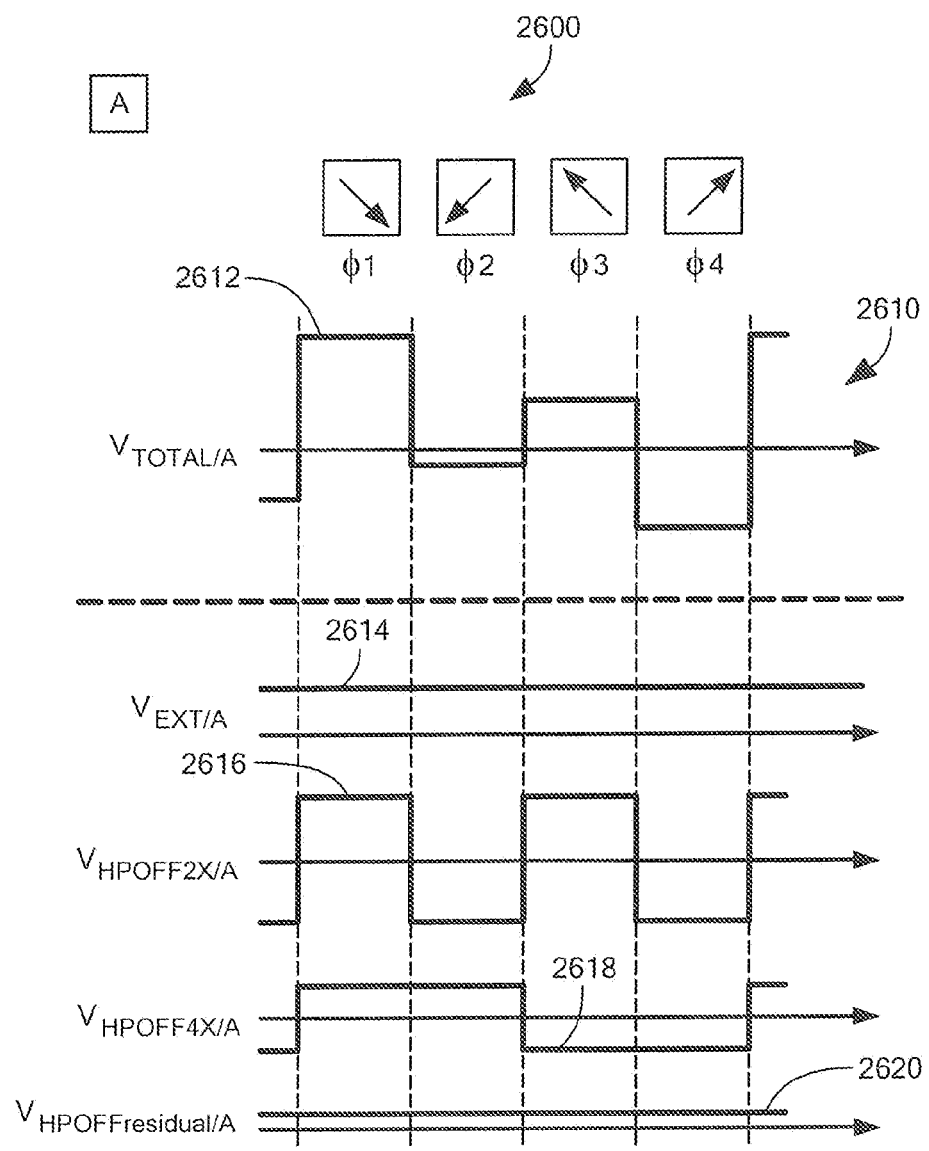
FIGS. 26-32 are graphs showing time domain signals in the magnetic field sensor of FIG. 25 when the magnetic field sensor operates in the measured-field-sensing configuration.

Referring now to FIG. 26, graphs 2610 have separate horizontal axes with scales in units of time in arbitrary units and separate vertical axes with sales in units of volts in arbitrary units.

A signal 2612 is representative of a signal at box labeled A of FIG. 25, i.e., a signal representative of four phase current spinning, i.e., four phase chopping, of the Hall effect elements 210, 212 during the above described measured-field-sensing configuration, responsive to the above-described measured-magnetic-field-responsive signal portion, and assuming that the four current spinning phases are adjacent in time. The four phases are represented by the block diagram 2600 of FIG. 26, and are representative of the above-described four-phase offset modulation. If instead, the above-described signal modulation were used, graphs 2610 would be different. Also, if the above-described signal modulation were used, then another switching circuit (a modulator) (not shown) can be coupled between the switching circuit 212 and the switching circuit 214.

In the graph 2612, it is apparent that each phase of the signal 2612 has a different undesirable offset signal (DC error signal). The graph 2612 is indicative of the above-described four phase offset modulation by the switching circuit 212 of FIG. 25.

For purposes of signals shown in other figures below, the time domain signal 2612 is broken into four separable time domain signal components 2614, 2616, 2618, 2620, which are treated separately in subsequent figures. Thus, the signal 2612 is referred to herein as a "composite signal." However, it will be recognized that the four signal components 2614, 2616, 2618, 2620 of FIG. 26 exist simultaneously and sum together, according to superposition, in the composite signal 2612 at the box labeled A of FIG. 25.

An external field signal component 2614, VEXT/A, is indicative of an external magnetic field sensed by the current sensor 2500 of FIG. 25. While the external field signal component 2614 is shown to be a DC signal for clarity, the external field signal 2614 could equally well be an AC signal.

When summed together, the external field signal component 2614, VEXT/A, a first current spinning offset signal component 2616, VHPOFF2X, a second current spinning offset signal component 2618, VHPOFF4X, and a residual current spinning offset signal component 2620, VHPOFFresidual, form the composite signal 2610.

It should be noted that the current spinning signal components 2616, 2618 above occur at different frequencies. If there is a current spinning frequency, Fspin, at which the Hall effect elements 208, 210 of FIG. 26 are sequentially switched in a current spinning arrangement (see, e.g., block diagram 2600), then a frequency of the current spinning offset signal component 2616 is Fspin, a frequency of the current spinning offset signal component 2614 is Fspin/2, and a frequency of the residual current spinning offset signal component 2620 is zero or DC. A frequency of the current spinning offset signal 2616, Fspin, has a frequency for which changes of state are the same as a rate of change of state of the phases of the current spinning 2600.

FIGS. 27, 28, 31 and 32 below are representative of time domain signal components associated with the magnetic field sensor 2500 of FIG. 25 at different ones of boxes labeled A, B, C, and D during the above-described measured-field-sensing configuration, responsive to an external magnetic field. For clarity, during the above-described measured-field-sensing configuration, effects upon most of the current spinning offset signal components of FIG. 26 are separately shown in FIGS. 27-32. However, the residual current spinning offset signal component 2620 of FIG. 26 is not shown in subsequent figures and it is assumed to have a value at or near zero.

FIGS. 33-36 show time domain signals during the other configuration described above, namely the reference-field-sensing configuration, responsive to a calibration magnetic field, as may be generated, for example, by the coils 206a, 206b of FIG. 25.

In FIGS. 27, 28, and 31-36, horizontal axes have scales in units or time in arbitrary units and vertical axes with scales in units of voltage in arbitrary units.

Figure 27:
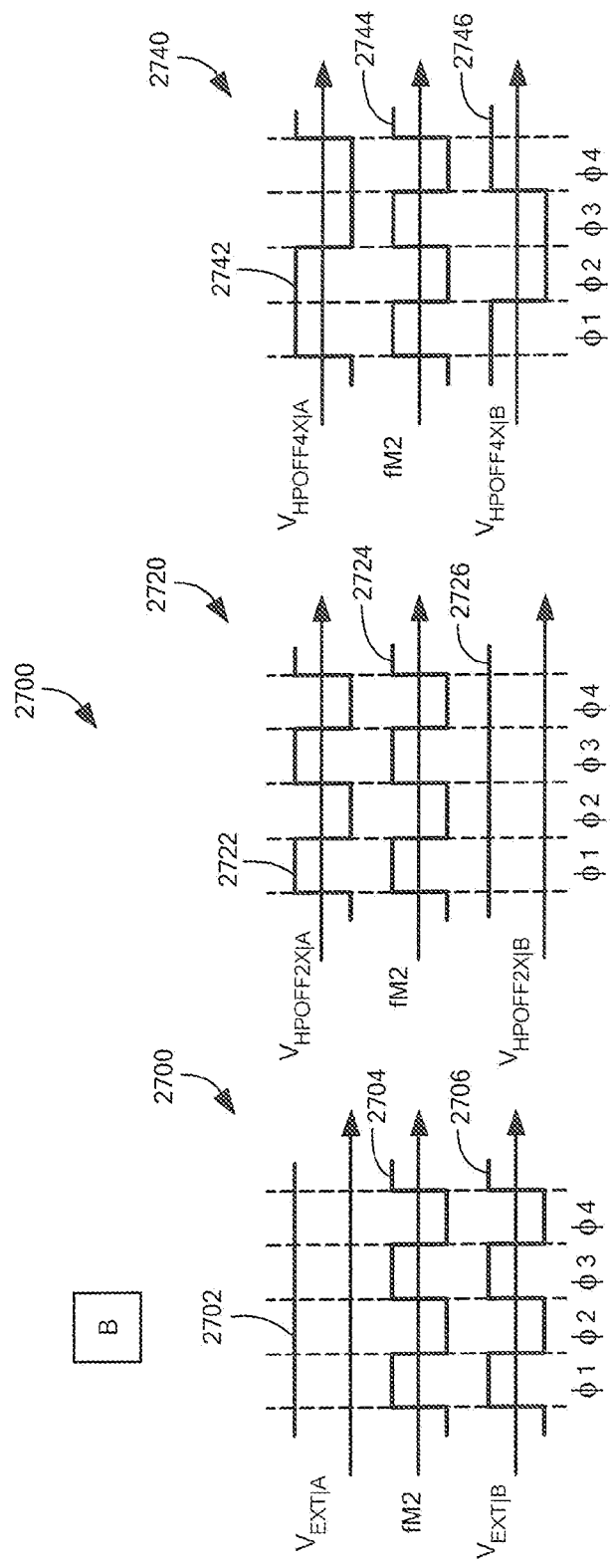

Referring now to FIG. 27, in a first graph 2700, a signal component 2702 is the same as the external magnetic field signal, VEXT/A, 2614 of FIG. 26 at the box labeled A of FIG. 25.

In a second graph 2720, a signal component 2722 is the same as the offset signal component 2616 of FIG. 26 at the box labeled A of FIG. 25.

In a third graph 2740, a signal component 2742 is the same as the offset signal component 2618 of FIG. 26 at the box labeled A of FIG. 25.

A clock signal, shown in three instances 2704, 2724, 2744, is representative of the clock signal 214a, fM2, of FIG. 25. The instances 2704, 2724, 2744 of the clock signal 214a, fM2, have the same frequency, Fspin, described above in conjunction with FIG. 26. The clock signal 214a, fM2, can have a fifty percent duty cycle.

In the first graph 2700, a signal component 2706 is representative of operation of the switching circuit 214 of FIG. 25 upon the signal component 2702, resulting in the signal component 2706 at the box labeled B of FIG. 25.

In the second graph 2720, a signal component 2726 is representative of operation of the switching circuit 214 of FIG. 25 upon the signal component 2722, resulting in the signal component 2726 at the box labeled B of FIG. 25.

In the third graph 2740, a signal component 2746 is representative of operation of the switching circuit 214 of FIG. 25 upon the signal component 2742, resulting in the signal component 2746 at the box labeled B of FIG. 25.

The signal components 2706, 2726, 2746 combine together to form a composite signal at the box labeled B in FIG. 25.

As described above in conjunction with FIG. 26, a residual signal component comparable to the residual signal component 2620 of FIG. 26 is not shown.

Figure 28:
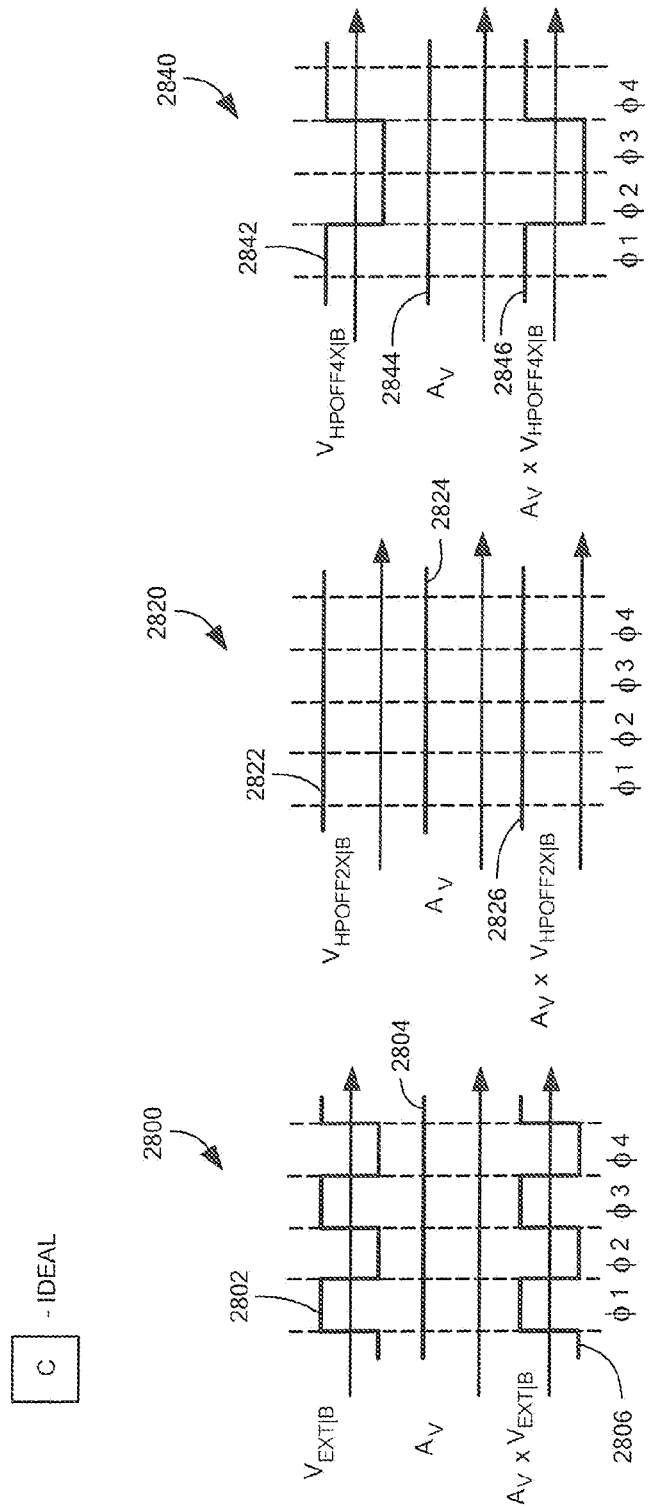

Referring now to FIG. 28, in a first graph 2800, a signal component 2802 is the same as the signal component 2706 of FIG. 27 at the box B of FIG. 25.

In a second graph 2820, a signal component 2822 is the same as the signal component 2726 of FIG. 27 at the box B of FIG. 25.

In a third graph 2840, a signal component 2842 is the same as the signal component 2746 of FIG. 27 at the box B of FIG. 25.

An ideal gain (i.e., with zero gain error) of the amplifier 216 of FIG. 25 is shown in three instances 2804, 2824, 2844.

In the first graph 2800, a signal component 2806 is representative of operation of the gain 2804 of the amplifier 216 of FIG. 25 upon the signal component 2802, resulting in the signal component 2806 at the box labeled C of FIG. 25.

In the second graph 2820, a signal component 2826 is representative of operation of the gain 2824 of the amplifier 216 of FIG. 25 upon the signal component 2822, resulting in the signal component 2826 at the box labeled C of FIG. 25.

In the third graph 2840, a signal component 2846 is representative of operation of the gain 2844 of the amplifier 216 of FIG. 25 upon the signal component 2842, resulting in the signal component 2846 at the box labeled C of FIG. 25.

The signal components 2806, 2826, 2846 combine together to form a composite signal at the box labeled C in FIG. 25, where, as described above, the gain of the amplifier 216 of FIG. 25 is ideal.

Figure 29:
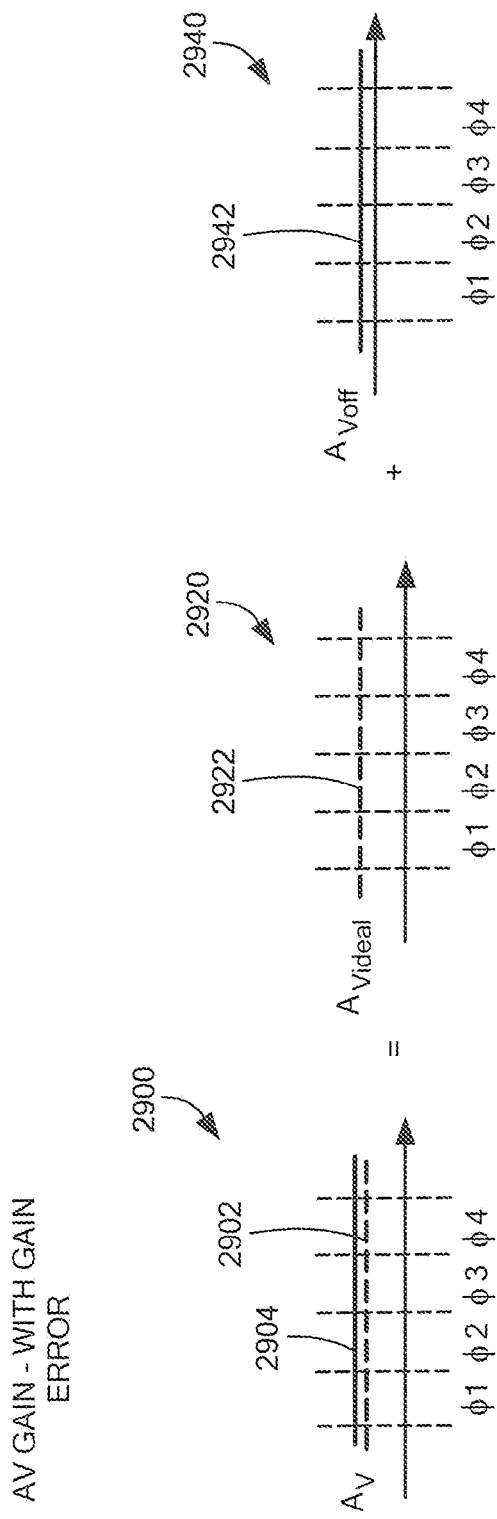
Figure 30:
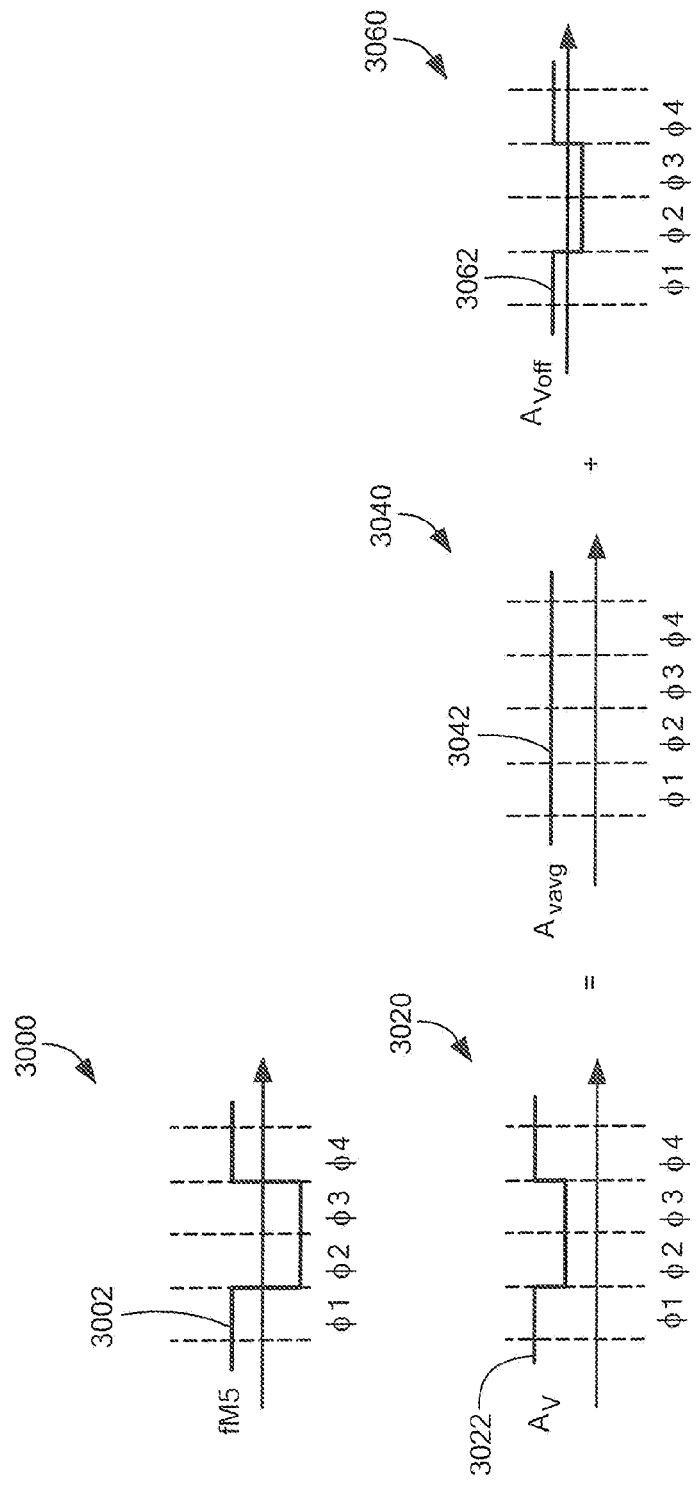

Referring now to FIG. 29, graphs 2900, 2920, 2940 are indicative of a non-ideal gain (i.e., a gain error) of the amplifier 216 of FIG. 25, as may be represented in one form by the voltage source 2504 of FIG. 25. In FIGS. 39 and 30, horizontal axes have scales in units of time in arbitrary units and vertical axes with scales in units of gain in arbitrary units.

A first graph 2900 shows an ideal gain 2902 of the amplifier 216 of FIG. 25 and an actual gain 2904 that has an error. The actual gain is shown to be higher in gain than the ideal gain 2902. It should be understood that another actual gain could instead be lower than the ideal gain 2902.

A second graph 2920 shows an ideal gain 2922, which is the same as the ideal gain 2902.

A third graph 2940 shows a gain error 2942, also referred to herein as a "gain offset."

The actual gain 2904 is the sum of the ideal gain 2902, 2922 and the gain offset 2942.

Referring now to FIG. 30, in a first graph 3000, a clock signal 3002 is the same as or similar to the clock signal 2508, fM5, of FIG. 25. The clock signal 3002 has half the frequency (i.e., Fspin/2 described above in conjunction with FIG. 26) of the instances 2704, 2724, 2744, of the clock signal, fM2, of FIG. 27, i.e., half of a frequency of a clock used to perform the current spinning of the Hall effect elements 208, 210 by the switching circuit 212 of FIG. 25. It is also apparent that the clock signal 3002 has a first state during the first and fourth states of the current spinning phases 2600 of FIG. 26, and a second different state during the second and third phases of the current spinning phases 2600.

In a second graph 3020, a gain 3022 is indicative of a gain of the amplifier 216 being switched up and down in accordance with the voltage source 2504 of FIG. 25 modulated by the clock signal 3002, fM5. An amplitude of the modulated gain 3022 is equal to two times the voltage of the voltage source 2504.

In a third graph 3040 and in a fourth graph 3060, it can be seen that the gain 3022 can be considered to be two separate gain components, an average gain component 3042 summed with a offset gain component 3062, AVoff. It should be understood that the average gain component is representative of a desired gain of the amplifier 216 without gain influence by the offset gain component 3062, i.e., without influence by the voltage source 2504. The average gain component 3042 is also representative of the ideal gain 2922 of FIG. 2.

Figure 31:
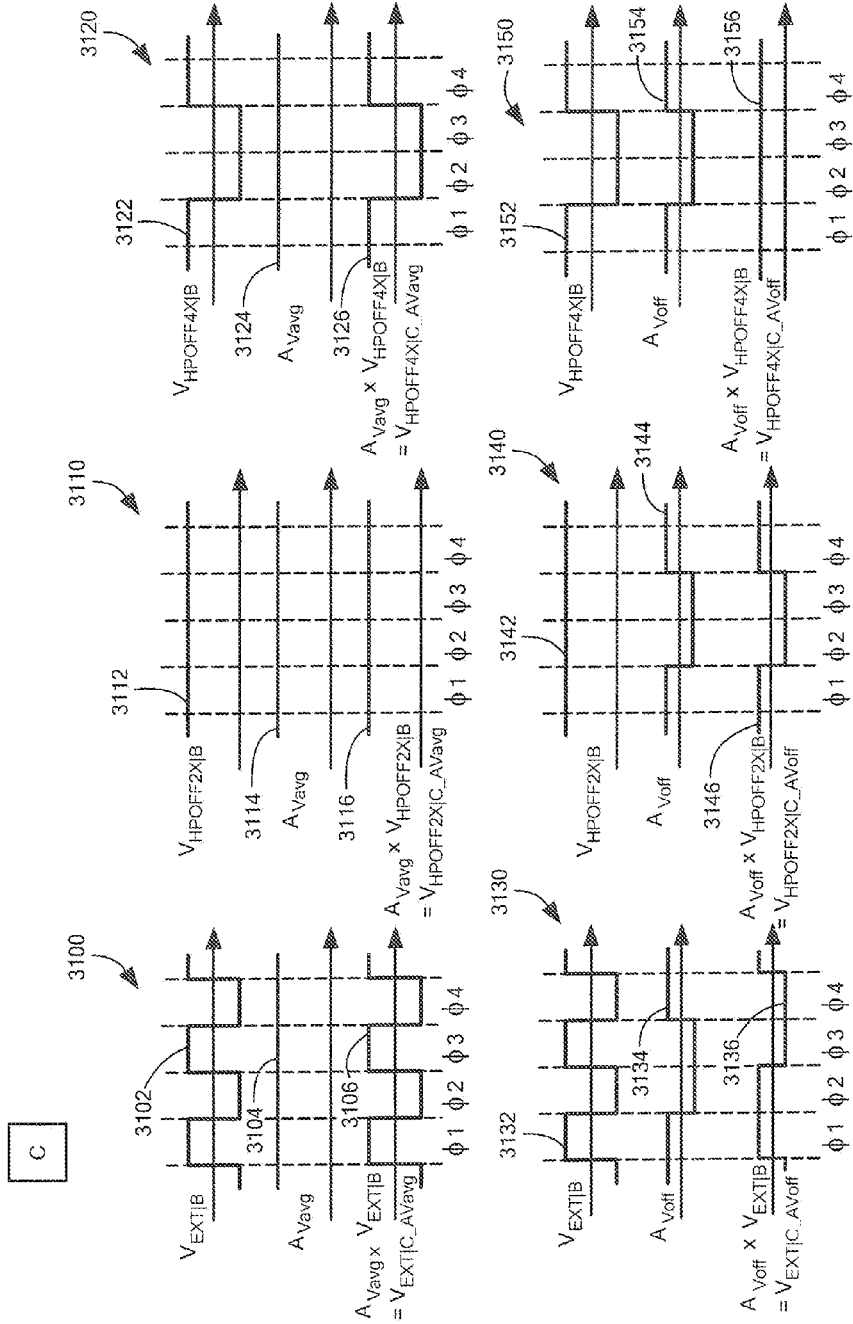

Referring now to FIG. 31, and using the concept of FIG. 30, which separates the gain into two components, an unlike the graphs of FIG. 28, which show only the ideal gain 2804, 2824, 2844, in a first graph 3100 and in a fourth graph 3130, signal components 3102, 3132 are the same as the signal component 2706 of FIG. 27 at the box B of FIG. 25.

In a second graph 3110 and in a fifth graph 3140, signal components 3112, 3142 are the same as the signal component 2726 of FIG. 27 at the box B of FIG. 25.

In a third graph 3120 and in a sixth graph 3150, signal components 3122, 3152 are the same as the signal component 2746 of FIG. 27 at the box B of FIG. 25.

An average gain of the amplifier 216 of FIG. 25 is shown in three instances 3104, 3114, 3124 of an average gain component the same as or similar to the average gain component 3042 of FIG. 30.

A gain error of the amplifier 216 of FIG. 25 is shown in three instances 3134, 3144, 3154 of an offset gain component, the same as or similar to the average gain component 3062 of FIG. 30.

In the first graph 3100, a signal component 3106 is representative of operation of the average gain component 3104 of the amplifier 216 of FIG. 25 upon the signal component 3102, resulting in the signal component 3106 at the box labeled C of FIG. 25 when in the measured-field-sensing configuration.

In the second graph 3110, a signal component 3116 is representative of operation of the average gain component 3114 of the amplifier 216 of FIG. 25 upon the signal component 3112, resulting in the signal component 3116 at the box labeled C of FIG. 25 when in the measured-field-sensing configuration.

In the third graph 3120, a signal component 3126 is representative of operation of the average gain component 3124 of the amplifier 216 of FIG. 25 upon the signal component 3122, resulting in the signal component 3126 at the box labeled C of FIG. 25 when in the measured-field-sensing configuration.

In the fourth graph 3130, a signal component 3136 is representative of operation of the offset gain component 3134 of the amplifier 216 of FIG. 25 upon the signal component 3132, resulting in the signal component 3136 at the box labeled C of FIG. 25 when in the measured-field-sensing configuration.

In the fifth graph 3140, a signal component 3146 is representative of operation of the offset gain component 3144 of the amplifier 216 of FIG. 25 upon the signal component 3142, resulting in the signal component 3146 at the box labeled C of FIG. 25 when in the measured-field-sensing configuration.

In the sixth graph 3150, a signal component 3156 is representative of operation of the offset gain component 3154 of the amplifier 216 of FIG. 25 upon the signal component 3152, resulting in the signal component 3156 at the box labeled C of FIG. 25 when in the measured-field-sensing configuration.

The signal components 3006, 3106, 3206, 3306, 3406, 3506 combine together to form a composite signal at the box labeled C in FIG. 25, where the gain of the amplifier 216 of FIG. 25 not ideal.

Figure 32:
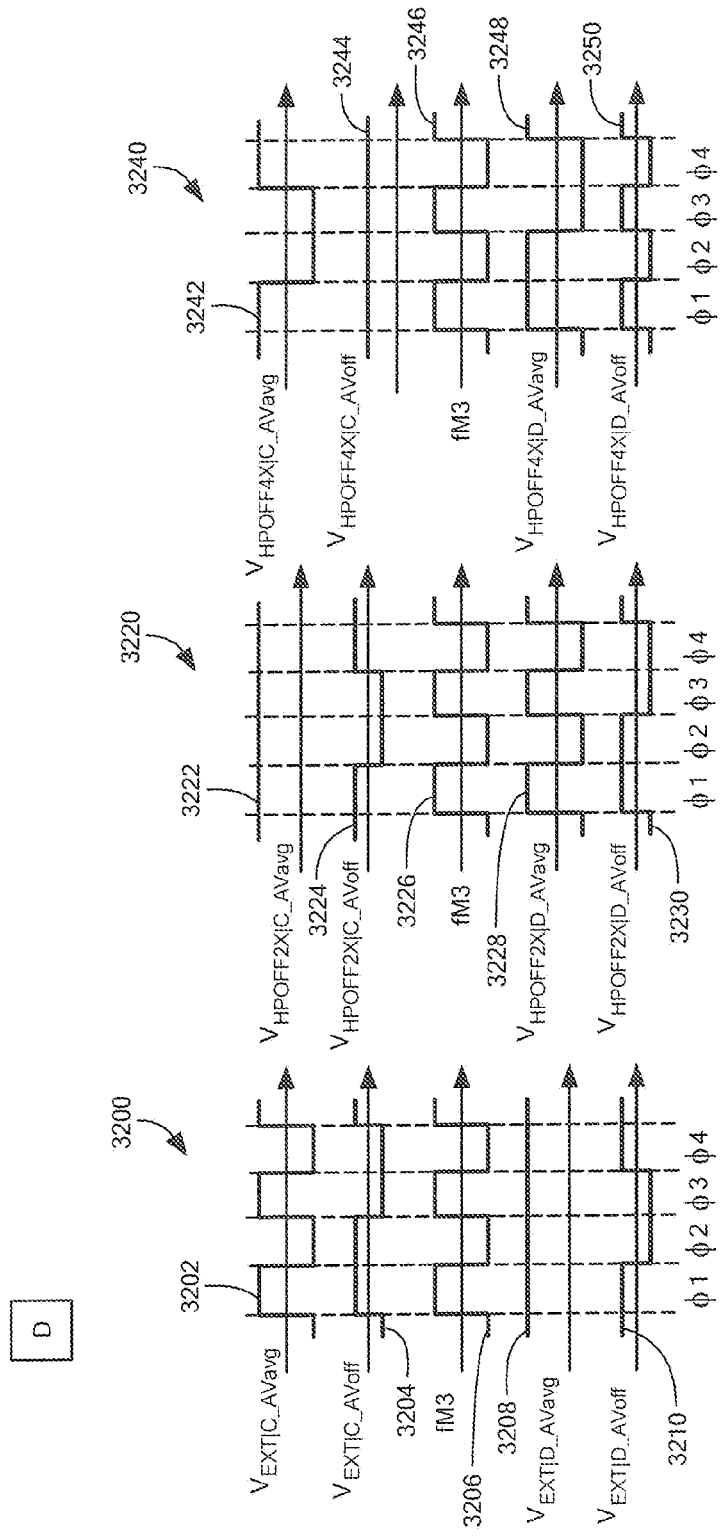

Referring now to FIG. 32, in a first graph 3200, signal components 3202, 3204 are the same as the signal components 3106, 3136 of FIG. 31 at the box labeled C of FIG. 25.

In a second graph 3220, signal components 3222, 3224 are the same as the signal components 3116, 3146 of FIG. 31 at the box labeled C of FIG. 25.

In a third graph 3240, signal components 3242, 3424 are the same as the signal components 3126, 3156 of FIG. 31 at the box labeled C of FIG. 25.

A clock signal is shown in three instances 3206, 3226, 3246 of the clock signal 2118a, fM3, of FIG. 25.

In the first graph 3200, signal components 3208, 3210 are representative of operation of the clock signal 3206, i.e., 218a, fM3, of FIG. 25, upon the signal components 3202, 3204, resulting in the signal component 3208, 3210 at the box labeled D of FIG. 25 when in the measured-field-sensing configuration.

In the second graph 3220, signal components 3228, 3230 are representative of operation of the clock signal 3226, i.e., 218a, fM3, of FIG. 25, upon the signal components 3222, 3224, resulting in the signal component 3228, 3230 at the box labeled D of FIG. 25 when in the measured-field-sensing configuration.

In the third graph 3240, signal components 3248, 3250 are representative of operation the clock signal 3246, i.e., 218a, fM3, of FIG. 25, upon the signal components 3242, 3244, resulting in the signal component 3248, 3250 at the box labeled D of FIG. 25 when in the measured-field-sensing configuration.

The signal components 3208, 3210, 3228, 3230, 3248, 3250 combine together to form a composite signal at the box labeled D in FIG. 25, where the gain of the amplifier 216 of FIG. 25 not ideal.

Inspecting the signal components 3208, 3210, 3228, 3230, 3248, 3250, it can be recognized that only the signal component 3208 is at DC (i.e., at baseband). Thus, predominantly only the signal component 3208 can pass through the filters 220, 222 of FIG. 25 to appear at the box labeled F of FIG. 25. Thus, it can be seen that, with the specific modulation provided by the switching circuit 2506 of FIG. 25, contributions by the offset signal component 3134, 3144, 3154 of FIG. 31 are removed, leaving only contribution by the particular average gain component 3104, i.e., the ideal gain of FIG. 29.

Figure 33:
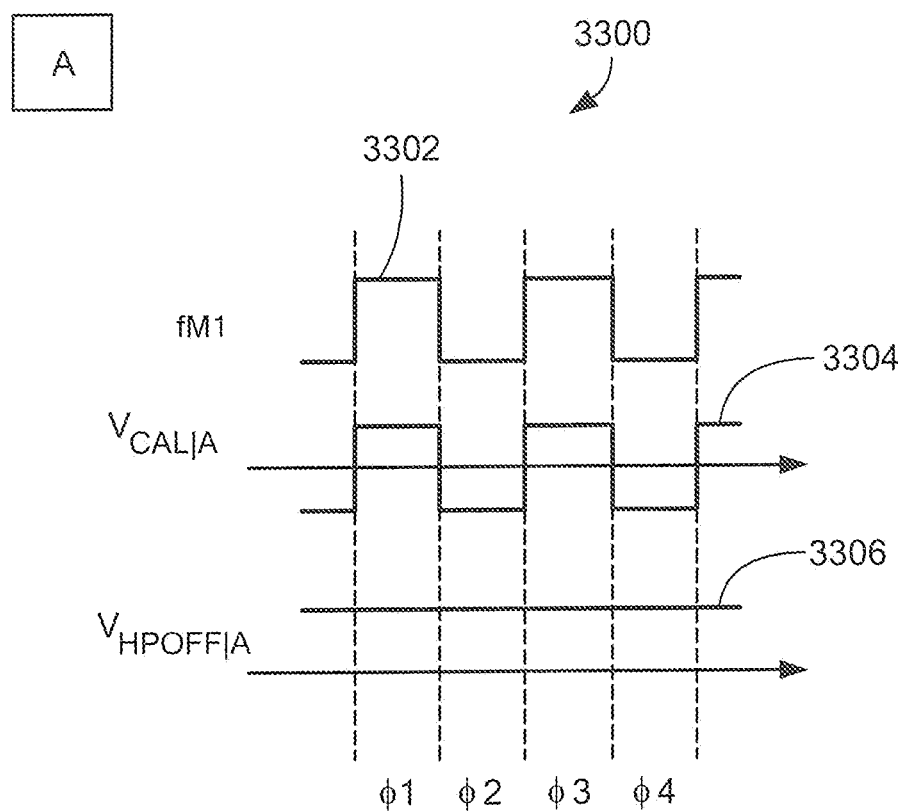
FIGS. 33-36 are graphs showing time domain signals in the magnetic field sensor of FIG. 25 when the magnetic field sensor operates in the reference-field-sensing configuration.

Turning now to the above-described reference-field-sensing configuration, and referring now to FIG. 33, a graph 33 shows a clock signal 3302 indicative of the clock signal 204a, fM1, of FIG. 25, which is used to drive a current in alternating directions through the coils 206a, 206b. The clock signal is at the same frequency as the clock signal 214a, fM2 of FIG. 25.

A signal 3304 is representative of a calibration signal component 3304 at the box labeled A in FIG. 25 in response to the current in alternating direction passing though the coils 206a, 206b.

A signal 3306 is representative of an offset signal component 3306 at the box labeled A. The offset signal 3306 corresponds to a residual sensitivity to the external or sensed magnetic field, ResBext, plus an undesirable offset voltage (no chopping) generated by the two magnetic field sensing elements 208, 210 of FIG. 25.

The signal components 3304, 3306 combine together to form a composite signal at the box labeled A in FIG. 25 when in the reference-field-sensing configuration.

Figure 34:
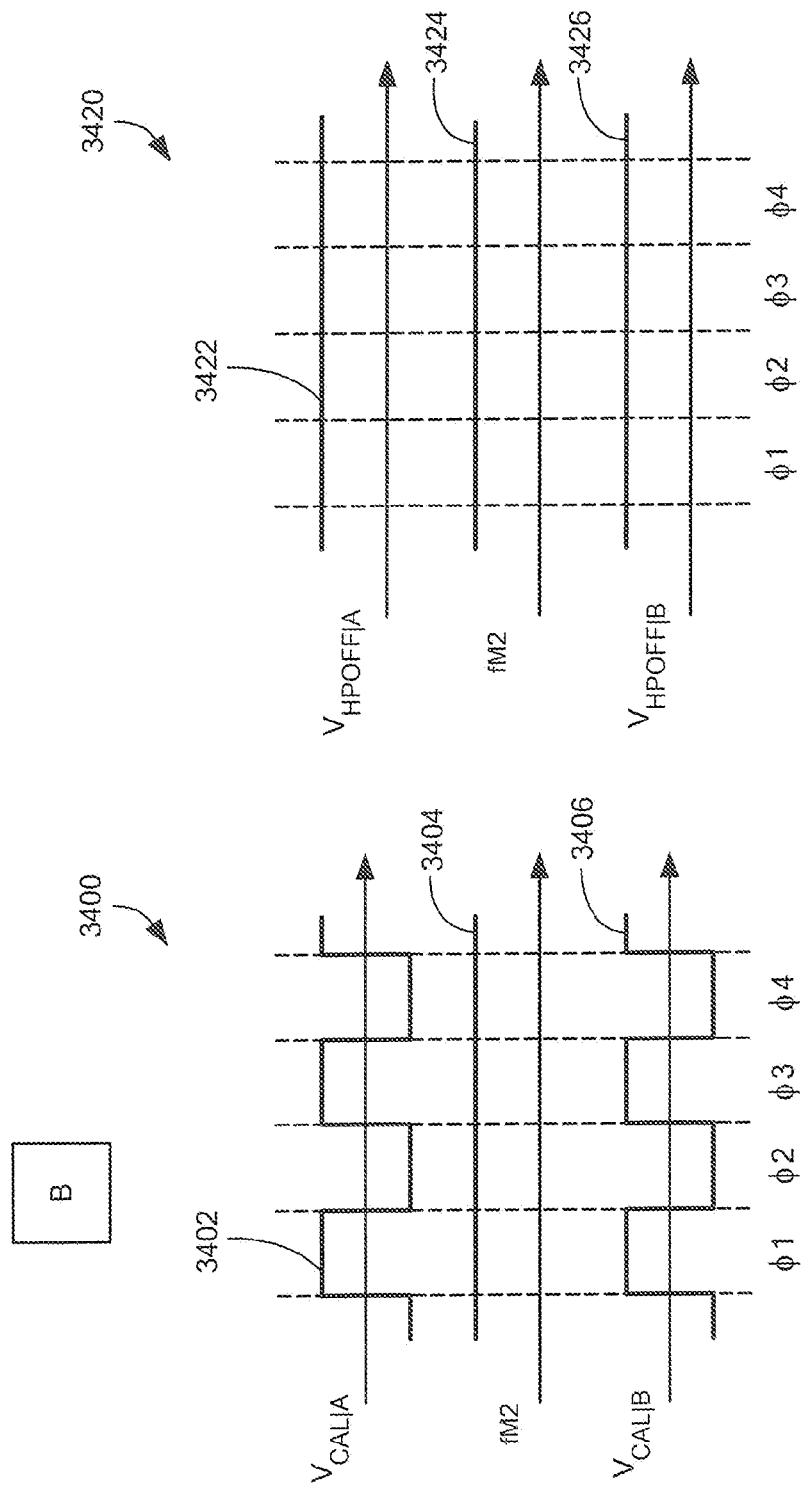

Referring now to FIG. 34, in a first graph 3400, a signal 3402 is the same as the signal 3304 of FIG. 33 and is representative of a calibration signal component 3402 at the box labeled A of FIG. 25.

In a second graph 3420, a signal 3422 is the same as the signal 3306 of FIG. 33 and is representative of an offset signal component 3404 at the box labeled A of FIG. 25.

A clock signal 3404, 3424 is common to both of the graphs 3400, 3420 and is indicative of the clock signal 214a, fM2, of FIG. 25 when the magnetic field sensor 2500 is in above-described reference-field-sensing configuration. As indicated, in the above-described reference-field-sensing configuration, clock signal 3404, 3424 is not generating modulation in the switching circuit 214 of FIG. 25, but instead, as shown in FIG. 19, the switching circuit 214 statically passes though the signal from the box labeled A to the box labeled B.

Therefore, a signal 3406 is the same as the signal 3402 and a signal 3426 is the same as the signal 3422. A sum of the signals 3406, 3426 appears at the box labeled B when in the measured-field-sensing configuration.

Figure 35:
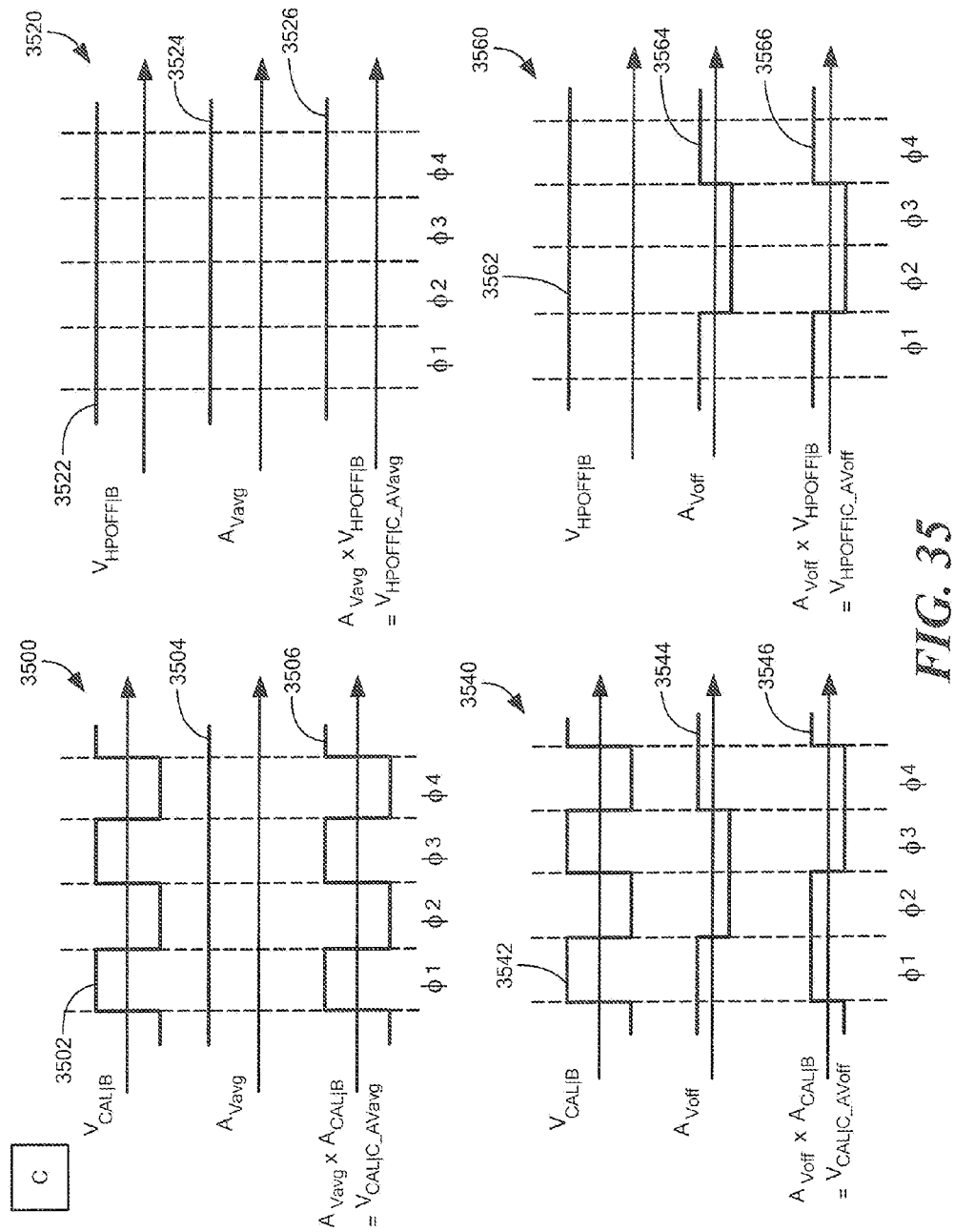

Referring now to FIG. 35, in a first graph 3500 and in a third graph 3540, a signal 3502 and a signal 3542 are the same as the signal 3406 of FIG. 34, and are indicative of a calibration signal component 3502, 3542.

In a second graph 3520 and in a fourth graph 3560, a signal 3522 and a signal 3562 are the same as the signal 3426 of FIG. 34, and are indicative of an offset signal component 3522, 3562.

In the first graph 3500 and in the second graph 3520, an average gain component 3504 is the same as an average gain component 3524, both of which are the same as the average gain component 3042 of FIG. 30.

In the third graph 3540 and in the fourth graph 3560, an offset gain component 3544 is the same as an offset gain component 3564, both of which are the same as the offset gain component 3062 of FIG. 30, which results from the modulation by the clock signal 3002 of FIG. 30, i.e., the clock signal 2508, fM5, of FIG. 25, having the particular frequency and phase shown in FIG. 30.

A sum of signal components 3506, 3526, 3546, 3566 appears at the point labeled C in FIG. 25 when the magnetic field sensor 2500 of FIG. 25 is operating in the in above-described reference-field-sensing configuration.

Figure 36:
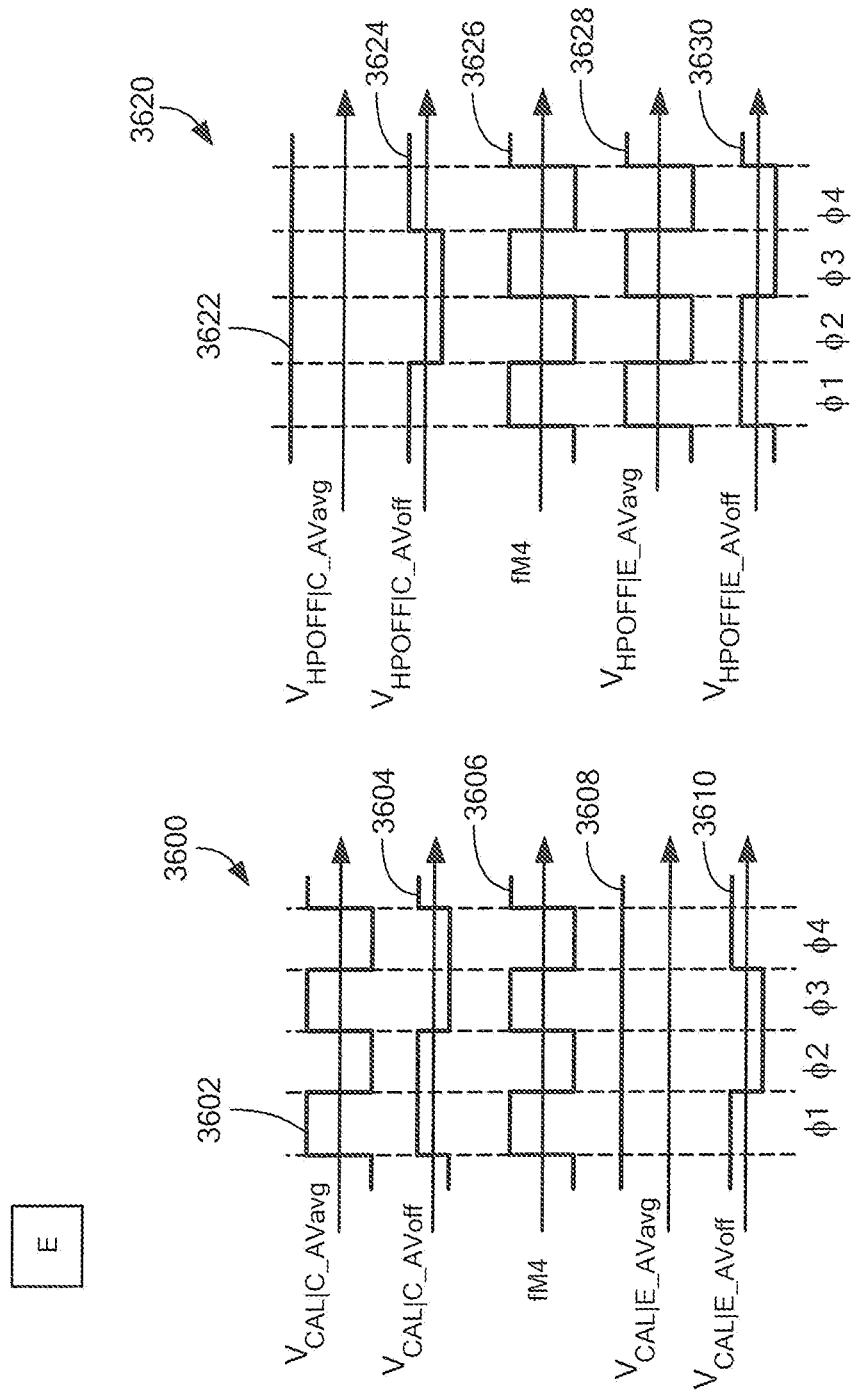

Referring now to FIG. 36, in a first graph 3600 signal components 3602, 3604 are the same as the signal components 3506, 3546 of FIG. 35 at the box C of FIG. 25.

In a second graph 3620, signal components 3622, 3624 are the same as the signal components 3526, 3566 of FIG. 35 at the box C of FIG. 25.

Two instances 3606, 3626 of a clock signal are the same and are the same as the clock signal 224a, fM4, of FIG. 25.

In the first graph 3600 and in the second graph 3620, signal components 3608, 3610, 3628, 3630 result from the modulation by the clock signals 3606, 3626 of FIG. 36, i.e., the clock signal 2508, fM5, of FIG. 25 having the particular frequency and phase shown in FIG. 30.

A sum of signal components 3608, 3610, 3628, 3630 appears at the point labeled E in FIG. 25 when the magnetic field sensor 2500 of FIG. 25 is operating in the in above-described reference-field-sensing configuration.

Inspecting the signal components 3608, 3610, 3628, 3630, it can be recognized that only the signal component 3608 is at DC (i.e., at baseband). Thus, predominantly only the signal component 3608 can pass through the filters 226, 228 of FIG. 25 to appear at the box labeled G of FIG. 25. Thus, it can be seen that, with the specific modulation provided by the switching circuit 2506 of FIG. 25, contributions by the offset component 3610, 3628, 3630, of FIG. 36 are removed, leaving only contribution corresponding to the calibration signal component 3608 multiplied by the average gain component 3504 of FIG. 35, without contribution from the gain offset component 3544.

In summary, contributions from the gain offset component (i.e., the voltage source 2504 of FIG. 25) are removed by the switching circuit 2506 operating with the particular clock signal 2508 fM5 having the frequency and phase represented, for example, by the clock signal 3002 of FIG. 30, both in the measured-field-sensing configuration and in the measured-field-sensing configuration.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
two or more Hall effect elements coupled together for generating a Hall effect element signal having a magnetic field component and an offset component, the magnetic field component responsive to an external magnetic field;
a switching circuit coupled to the Hall effect element and configured to generate a chopped signal representative of a four phase current spinning of the Hall effect element, the four phase current spinning having four phases including a first phase, a second phase following the first phase, a third phase following the second phase, and a fourth phase following the third phase, the four phases periodically repeating, wherein changes between the four phases occur at a phase rate;
a first modulator coupled to the chopped signal and configured to modulate a signal related to the chopped signal with a first modulator clock signal, wherein the first modulator clock signal has a first frequency for which changes of states of the first modulator clock signal occur at the phase rate;
a channel amplifier coupled to the first modulated signal, coupled to a gain adjustment signal, and configured to generate an amplified signal having a gain responsive to the gain adjustment signal, wherein the gain of the channel amplifier has a gain average component and a gain offset component;
a second modulator coupled to the amplified signal and configured to modulate a signal related to the amplified signal with a second modulator clock signal having the same first frequency to generate a second modulated signal;
an error amplifier coupled to a calibration signal, the calibration signal representative of a measured sensitivity of at least a portion of the magnetic field sensor in response to a calibration magnetic field, the error amplifier operable to compare the calibration signal to a reference signal to generate a comparison signal;

a third modulator coupled to the comparison signal and configured to modulate a signal related to the comparison signal with a third modulator clock signal having a second different frequency equal to the first frequency divided by two to generate a third modulated signal, wherein a first state of the third modulator clock signal occurs during the second and third phase of the four phases and a second state of the third modulator clock signal occurs during the first and fourth phases of the four phases, wherein the gain adjustment signal received by the channel amplifier comprises the third modulated signal; and a filter coupled to the second modulator signal and operable to generate a magnetic field sensor signal responsive to the external magnetic field, the magnetic field sensor signal responsive the external magnetic field, the magnetic field sensor signal having an amplitude more responsive to the gain average component than to the gain offset component.

2. The magnetic field sensor of claim 1, wherein the switching circuit is arranged as an offset modulator to modulate the offset component to a higher frequency or arranged as a signal modulator to modulate the magnetic field signal component to a higher frequency.

3. The magnetic field sensor of claim 1, wherein the switching circuit is arranged as an offset modulator to modulate the offset component to a higher frequency.

4. The magnetic field sensor of claim 1, wherein the switching circuit is arranged as a signal modulator to modulate the signal component to a higher frequency.

5. The magnetic field sensor of claim 1, wherein the filter comprises a switched capacitor notch filter.

6. The magnetic field sensor of claim 5, wherein the filter has a lowest notch frequency at the second clock frequency.

7. The magnetic field sensor of claim 1, wherein the filter comprises a switched capacitor low pass filter.

8. The magnetic field sensor of claim 7, wherein the filter has a lowest notch frequency at one half of the first clock frequency.

9. The magnetic field sensor of claim 1, wherein the filter comprises a digital notch filter.

10. The magnetic field sensor of claim 9, wherein the filter has a lowest notch frequency at one half of the first clock frequency.

11. The magnetic field sensor of claim 1, wherein the filter comprises a digital low pass filter.

12. The magnetic field sensor of claim 11, wherein the filter has a lowest notch frequency one half of at the first clock frequency.

13. The magnetic field sensor of claim 1, wherein the two or more Hall effect elements, the switching circuit, the first modulator, the channel amplifier, the second modulator, the filter, the error amplifier, and third modulator are disposed on or over a common semiconductor substrate.

14. The magnetic field sensor of claim 1, further comprising a calibration circuit to generate the calibration signal, the calibration circuit comprising:

a calibration magnetic field generator disposed proximate to the two or more Hall effect elements and operable to generate the calibration magnetic field.

15. The magnetic field sensor of claim 1, wherein the calibration magnetic field generator comprises;

a calibration modulator configured to modulate a DC signal with a calibration modulator clock signal having the same first frequency to generate a calibration modulated signal; and a conductive coil disposed proximate the two or more Hall effect elements and coupled to the calibration modulated signal to generate the calibration magnetic field.

16. The magnetic field sensor of claim 15, wherein the conductive coil comprises a conductive coil formed in a metal layer disposed on or over a semiconductor substrate.

17. The magnetic field sensor of claim 15, wherein the two or more Hall effect elements, the switching circuit, the first modulator, the channel amplifier, the second modulator, the filter, the error amplifier, the third modulator, the calibration modulator, and the conductive coil are disposed on or over a semiconductor substrate.

18. A method of calibrating a magnetic field sensor, comprising:

generating, with two or more Hall effect elements coupled together, a Hall effect element signal having a magnetic field component and an offset component, the magnetic field component responsive to the magnetic field;

current spinning, with a switching circuit, the field sensing element in four current spinning phases, the four current spinning phases including a first phase, a second phase immediately following the first phase, a third phase immediately following the second phase, and a fourth phase immediately following the third phase, the four current spinning phases periodically repeating, wherein changes between the four current spinning phases occur at a phase rate;

modulating the chopped signal with a first modulator, the first modulator configured to modulate a signal related to the chopped signal with a first modulator clock signal having the first frequency to generate a first modulated signal, wherein the first modulator clock signal has a first frequency for which changes of states of the first modulator clock signal occur at the phase rate;

amplifying the first modulated signal with a channel amplifier, the channel amplifier coupled to a gain adjustment signal, the channel amplifier to generate an amplified signal having a gain responsive to the gain adjustment signal, wherein the gain of the channel amplifier has a gain average component and a gain offset component;

modulating the amplified signal with a second modulator, the second modulator configured to modulate a signal related to the amplified signal with a second modulator clock signal having the same first frequency to generate a second modulated signal;

amplifying a calibration signal with an error amplifier, the calibration signal representative of a measured sensitivity of at least a portion of the magnetic field sensor in response to a calibration magnetic field, the error amplifier operable to compare the calibration signal to a reference signal to generate a comparison signal;

modulating the comparison signal with a third modulator, the third modulator configured to modulate a signal related to the comparison signal with a third modulator clock signal having a second different frequency equal to the first frequency divided by two to generate a third modulated signal, wherein a first state of the third modulator clock signal occurs during the second and third phase of the four phases and a second state of the third modulator clock signal occurs during the first and fourth phases of the four phases, wherein the gain adjustment signal received by the channel amplifier comprises the third modulated signal; and filtering the second modulator signal with a filter, the filter operable to generate a magnetic field sensor signal responsive to the external magnetic field, the magnetic field sensor signal responsive the external magnetic field, the magnetic field sensor signal having an amplitude more responsive to the gain average component than to the gain offset component.

19. The method of claim 18, wherein the two or more Hall effect elements, the switching circuit, the first modulator, the channel amplifier, the second modulator, the filter, the error amplifier, and third modulator are disposed on or over a common semiconductor substrate.

20. The method of claim 18, further comprising calibrating with a calibration circuit to generate the calibration signal, the calibration circuit comprising:
a calibration magnetic field generator disposed proximate to the two or more Hall effect elements and operable to generate the calibration magnetic field.

21. The method of claim 18, wherein the calibration magnetic field generator comprises;

a calibration modulator configured to modulate a DC signal with a calibration modulator clock signal having the same first frequency to generate a calibration modulated signal; and
a conductive coil disposed proximate the two or more Hall effect elements and coupled to the calibration modulated signal to generate the calibration magnetic field.

22. The method of claim 21, wherein the conductive coil comprises a coil formed in a metal layer disposed on or over a semiconductor substrate.

23. The method of claim 21, wherein the two or more Hall effect elements, the switching circuit, the first modulator, the channel amplifier, the second modulator, the filter, the error amplifier, the third modulator, the calibration modulator, and the conductive coil are disposed on or over a semiconductor substrate.

* * * * *

UNITED STATES PATENT AND TRADEMARK OFFICE
CERTIFICATE OF CORRECTION

PATENT NO. : 9,551,762 B1
APPLICATION NO. : 14/812313
DATED : January 24, 2017
INVENTOR(S) : Juan Manuel Cesaretti Page 1 of 1

It is certified that error appears in the above-identified patent and that said Letters Patent is hereby corrected as shown below:

Column 2, Line 13, delete "April 122, 2011" and replace with --April 12, 2011--.

Column 9, Line 24, delete "$\varphi_0 \cdot$" and replace with --$\Phi_0 \cdot$,--.

Column 11, Line 9, delete "The word phase as used herein does not" and replace with --The word "phase," as used herein, does not--.

Column 15, Line 39, delete "FIGS. 6 and 7, phases phase 1," and replace with --FIGS. 6 and 7, phases: phase 1,--.

Column 16, Line 60, delete "FIG. 6, 7 or 11." and replace with --FIGS. 6, 7, or 11.--.

Column 20, Line 63, delete "leaving only the a spectral line" and replace with --leaving only a spectral line--.

Column 30, Line 24, "that that scope" and replace with --that the scope--.

Signed and Sealed this
Thirtieth Day of October, 2018

Andrei Iancu
*Director of the United States Patent and Trademark Office*